(12) United States Patent
Kweon et al.

(10) Patent No.: US 7,045,071 B2
(45) Date of Patent: May 16, 2006

(54) METHOD FOR FABRICATING FERROELECTRIC RANDOM ACCESS MEMORY DEVICE

(75) Inventors: Soon-Yong Kweon, Ichon-shi (KR); Seung-Jin Yeom, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 170 days.

(21) Appl. No.: 10/739,434

(22) Filed: Dec. 17, 2003

(65) Prior Publication Data

US 2004/0129670 A1    Jul. 8, 2004

(30) Foreign Application Priority Data

Dec. 30, 2002  (KR) ............... 10-2002-0086177
Feb. 5, 2003   (KR) ............... 10-2003-0007224

(51) Int. Cl.
*H01B 13/00*    (2006.01)
*H01L 21/00*    (2006.01)

(52) U.S. Cl. ............ 216/13; 216/17; 216/18; 216/22; 438/715; 252/79.1

(58) Field of Classification Search ........ 216/17, 216/18, 22, 13, 83; 438/715; 252/79.1
See application file for complete search history.

(56) References Cited

U.S. PATENT DOCUMENTS 6,191,049 B1 * 2/2001 Song ................ 438/758
6,238,934 B1 * 5/2001 Yang ................ 438/3
6,603,169 B1 * 8/2003 Lee ................. 257/310
6,867,094 B1 * 3/2005 Park ................ 438/253

FOREIGN PATENT DOCUMENTS

KR    2003-23844    3/2003

OTHER PUBLICATIONS

Y. Nagano, et al., 0.18um SBT-Based Embedded FeRAM Operating at a Low Voltage of 11V, 2003 Symposium on VLSI Technology Digest of Technical Papers.

* cited by examiner

*Primary Examiner*—Shamim Ahmed
(74) *Attorney, Agent, or Firm*—Blakely Sokoloff Taylor & Zafman

(57) ABSTRACT

The present invention relates to a method for fabricating a ferroelectric random access memory device. The method includes the steps of: (a) forming a first inter-layer insulation layer on a substrate providing a transistor; (b) etching the first inter-layer insulation layer to form a storage node contact hole exposing a partial portion of the substrate; (c) burying a storage node contact including a plug and a barrier metal layer into the storage node contact hole; (d) forming an adhesion layer on the storage node contact and the first inter-layer insulation layer; (e) inducing a predetermined portion of the adhesion layer to be cracked, the predetermined portion disposed above an upper part of the plug; (f) selectively removing the cracked predetermined portion to expose a surface of the barrier metal layer formed on the plug; and (g) forming a ferroelectric capacitor connected to the plug through the exposed surface of the barrier metal layer.

14 Claims, 19 Drawing Sheets

TiN OXIDATION

METHOD FOR FABRICATING FERROELECTRIC RANDOM ACCESS MEMORY DEVICE

FIELD OF THE INVENTION

The present invention relates to a method for fabricating a semiconductor device; and, more particularly, to a method for fabricating a ferroelectric random access memory (FeRAM) device.

DESCRIPTION OF RELATED ARTS

It has been continuously attempted to develop a semiconductor memory device capable of operating a large scale of memory size and overcoming a limitation in refresh required by a dynamic random access memory (DRAM) device by employing a ferroelectric thin layer for a ferroelectric capacitor. Such a ferroelectric random access memory (FeRAM) device using the ferroelectric thin layer is a nonvolatile memory device. That is, the FeRAM device has an advantage of retrieving stored information even if the power is turned off. Also, the FeRAM device has been recently highlighted as one of the next generation memory devices by having a compatible operation speed to a DRAM device.

For an upper electrode and a bottom electrode of the ferroelectric capacitor, noble metal with good electrode characteristics such as platinum (Pt), iridium (Ir), ruthenium (Ru) are commonly used. However, such noble metal used as the bottom electrode has a weak adhesion with an inter-layer insulation layer, especially an oxide layer. Thus, during a subsequent dielectric layer deposition process, a thermal process and a cleaning process, there occurs a lifting phenomenon between the inter-layer insulation layer and the bottom electrode, further resulting in structural deformation, which impedes effective fabrication of semiconductor devices. To solve this problem, it is contrived to form an adhesion layer between the bottom electrode and the inter-layer insulation layer.

FIGS. 1A to 1E are cross-sectional views illustrating a conventional method for fabricating a ferroelectric random access memory (FeRAM) device.

Referring to FIG. 1A, field oxide layers 12 are formed in a substrate 11, and an impurity junction region 13 such as a source/drain region of a transistor is formed in the substrate 11. A first inter-layer insulation layer 14 with a multi-layer structure is formed on the substrate 11. At this time, the reason for forming the first inter-layer insulation layer 14 in the multi-layer structure is to insulate a word line, a landing plug and a bit line before forming a storage node contact (SNC).

Next, the first inter-layer insulation layer 14 is etched to form a storage node contact hole 15 exposing a partial portion of the impurity junction region 13. Then, a titanium (Ti) layer 16 and a first titanium nitride (TiN) layer 17 are sequentially deposited as a barrier metal layer on a structure including the storage node contact hole 15 and the first inter-layer insulation layer 14. A rapid thermal annealing (RTA) process is performed to form a titanium silicide (TiSi$_x$) layer 18 on an interface between the impurity junction region 13 and the titanium layer 16. The titanium silicide layer 18 serves as an ohmic contact.

Afterwards, a second titanium nitride layer 19 is deposited as another barrier metal layer on the first titanium nitride layer 17. A tungsten (W) layer 20 is deposited on the second titanium nitride layer 19 until the tungsten layer 20 fills the storage node contact hole 15.

Referring to FIG. 1B, the tungsten layer 20 and the first and the second titanium nitride layers 17 and 19 are subjected to an etch-back process so as to be recessed with a predetermined depth within the storage node contact hole 15. That is, after the etch-back process, a tungsten plug 20A is formed within the storage node contact hole 15 with a predetermined depth.

A third titanium nitride layer 21 is deposited as another barrier metal layer on a structure including the tungsten plug 20A and the first inter-layer insulation layer 14. Then, a chemical mechanical polishing (CMP) process is performed until a surface of the first inter-layer insulation layer 14 is exposed. After the CMP process, the third titanium nitride layer 21 remains only on the tungsten plug 20A formed within the storage node contact hole 15. Eventually, the storage node contact has a structure including triple barrier metal layers of the first titanium nitride layer 17, the second titanium nitride layer 19 and the third titanium nitride layer 21 and the tungsten plug 20A.

Referring to FIG. 1C, an adhesion layer 22 is deposited on the planarized first inter-layer insulation layer 14 and the third titanium nitride layer 21. At this time, the adhesion layer 22 is made of alumina ($Al_2O_3$).

Then, a masking and etching process is performed to open a predetermined portion of the adhesion layer 22 disposed above an upper part of the tungsten plug 20A. That is, a photosensitive layer is deposited on the adhesion layer 22 and is subjected to a photo-exposure and developing process to form a contact mask for etching the adhesion layer 22. Then, the adhesion layer 22 is etched with use of the contact mask as an etch mask to open the upper part of the tungsten plug 20A.

Referring to FIG. 1D, an iridium (Ir) layer 23, an iridium oxide ($IrO_2$) layer 24 and a platinum (Pt) layer 25 are deposited on the above resulting structure. The iridium layer 23, the iridium oxide layer 24 and the platinum layer 25 are sequentially etched to form a bottom electrode. Eventually, the bottom electrode is formed on the upper part of the tungsten plug 20A by having a stack structure including the platinum layer 25, the iridium oxide layer 24 and the iridium layer 23, and the adhesion layer 22 remains between the iridium layer 23 of the bottom electrode and the first inter-layer insulation layer 14.

After the formation of the bottom electrode, a second inter-layer insulation layer 26 is deposited on an entire surface of the above resulting structure including the bottom electrode. The CMP process is performed to the second inter-layer insulation layer 26 until a surface of the platinum layer 25 is exposed. From this CMP process, the second inter-layer insulation layer 26 remains such that it encompasses the bottom electrode.

Then, a ferroelectric layer 27 is deposited on the second inter-layer insulation layer 26 and the platinum layer 25, and an upper electrode 28 is formed on the ferroelectric layer 27. A high thermal process proceeds to crystallize the ferroelectric layer 27.

Referring to FIG. 1E, the upper electrode 28 is etched, and a recovery thermal process is performed to recover the damaged ferroelectric layer 27 during the etching of the upper electrode 28.

The above described method is disadvantageous by requiring an additional process for etching the adhesion layer 22 to make the upper part of the tungsten plug 20A be exposed. Also, as a semiconductor device has become highly integrated, there is not a sufficient margin for the etching process for etching the adhesion layer 22 with respect to the bottom electrode.

Because of this insufficient margin, the adhesion layer 22 may not be formed on between the bottom electrode and the first inter-layer insulation layer 14. Thus, in a region in which the adhesion layer 22 is not formed, oxygen might be diffused along an interface between the bottom electrode and the first inter-layer insulation layer 14 during the high thermal process for crystallizing the ferroelectric layer 27 and the recovery thermal process. This oxygen diffusion is denoted as a bold arrow 29 in FIGS. 1D and 1E.

FIG. 2 is a micrograph of transmission electron microscopy (TEM) showing the third titanium nitride layer after the thermal process for crystallizing the ferroelectric layer.

As shown, the third titanium nitride layer is oxidated as the oxygen is diffused along the interface between the bottom electrode and the first inter-layer insulation layer during the high thermal process. Especially, because of the diffused oxygen during the high thermal process, the third titanium nitride layer is abruptly expanded and a phase of constitution elements of the third titanium nitride layer is changed into a vapor one. The oxidation of the third titanium nitride layer may increase leakage currents.

FIG. 3 is a graph showing the measured contact resistance values when the conventional method is employed.

As shown, the horizontal axis represents a contact resistance in unit of ohm ($\Omega$) per plug, while the vertical axis represents a cumulative probability in percentage (%). Also, the result values marked in symbols of $\nabla$, $\Delta$, ⊞ and ⊖ express the contact resistance values obtained by an overlap effect between the bottom electrode and the storage node contact. For instance, a BEover45 $\nabla$ shows that the bottom electrode is largely overlapped with the storage node contact. A BEover22 ⊞ shows the smallest overlap between the bottom electrode and the storage node contact.

In more detail, values of the contact resistance between the bottom electrode and the tungsten plug are distributed in a range from about 50 M$\Omega$ to about 100 M$\Omega$. As described above, the bottom electrode and the tungsten plug is electrically connected with each other through the opening formed by the masking and etching process for the adhesion layer. The measured contact resistance values are relatively high, and the greater the overlap between the storage node contact and the bottom electrode is, the smaller the contact resistance is.

As described above, in the conventional method, there may not be a sufficient process margin for the masking and etching process for opening the predetermined portion of the adhesion layer. This fact results that oxygen is easily diffused into the titanium nitride layer during the thermal process for crystallizing the ferroelectric layer and oxidize the titanium nitride layer. As a result, the oxidated titanium nitride layer may become a negative factor for increasing leakage currents, which in turn, increase the contact resistance between the bottom electrode and the tungsten plug contained in the resulted device.

SUMMARY OF THE INVENTION

It is, therefore, an object of the present invention to provide a method for fabricating a ferroelectric random access memory (FeRAM) device capable of preventing oxidation of a barrier metal layer of a storage node contact due to oxygen diffused along an interface between a bottom electrode and an inter-layer insulation layer during a high thermal process.

It is another object of the present invention to provide a method for fabricating a FeRAM device capable of solving a problem of an insufficient process margin caused by an additional masking and etching process for opening a portion of an adhesion layer formed above an upper part of a tungsten plug.

In accordance with an aspect of the present invention, there is provided a method for fabricating a ferroelectric random access memory device, including the steps of: (a) forming a first inter-layer insulation layer on a substrate providing a transistor; (b) etching the first inter-layer insulation layer to form a storage node contact hole exposing a partial portion of the substrate; (c) burying a storage node contact including a plug and a barrier metal layer into the storage node contact hole; (d) forming an adhesion layer on the storage node contact and the first inter-layer insulation layer; (e) inducing a predetermined portion of the adhesion layer to be cracked, the predetermined portion disposed above an upper part of the plug; (f) selectively removing the cracked predetermined portion to expose a surface of the barrier metal layer formed on the plug; and (g) forming a ferroelectric capacitor connected to the plug through the exposed surface of the barrier metal layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, variously applicable preferred embodiments of the present invention will be described in detail with reference to the accompanying drawings.

FIGS. 4A to 4G are cross-sectional views illustrating a method for fabricating a ferroelectric random access memory (FeRAM) device in accordance with a first preferred embodiment of the present invention.

Figure 4A:
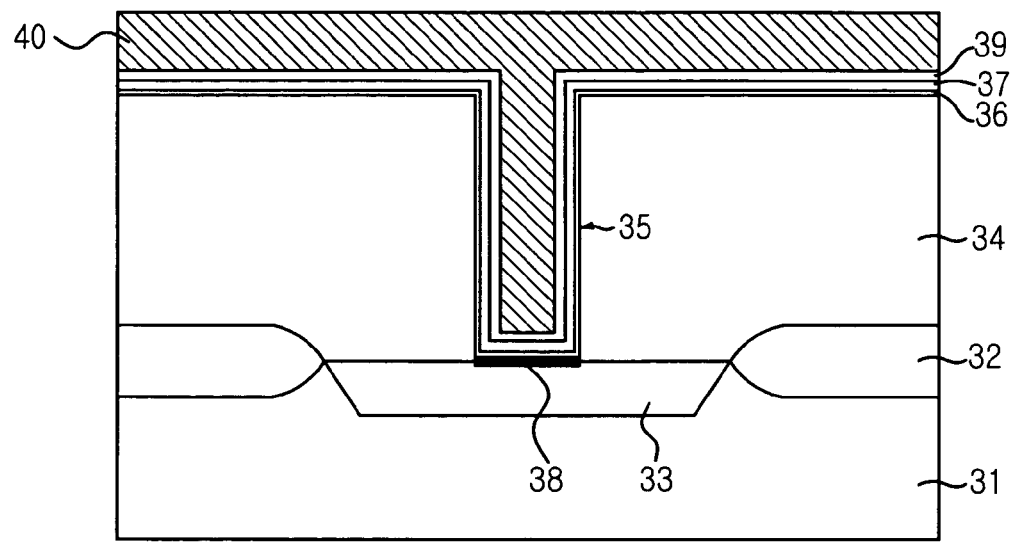
FIGS. 4A to 4G are cross-sectional views illustrating a method for fabricating a FeRAM device in accordance with a first preferred embodiment of the present invention.

Referring to FIG. 4A, field oxide layers 32 are formed in a substrate 31, and an impurity junction region 33 such as a source/drain region of a transistor is formed in the substrate 31. Then, a first inter-layer insulation layer 34 is formed on the substrate 31. At this time, the first inter-layer insulation layer 34 has a multi-layer structure to insulate a word line, a landing plug and a bit line before forming a storage node contact. Preferably, the first inter-layer insulation layer 34 is made of a material selected from a silicon oxide group consisting of high density plasma (HDP) oxide, borophosphosilicate glass (BPSG), phosphosilicate glass (PSG), middle temperature oxide (MTO), high temperature oxide (HTO) and tetraethylorthosilicate (TEOS) oxide. After the deposition of the first inter-layer insulation layer 34, a chemical mechanical polishing (CMP) process for the purpose of planarization or a thermal process for the purpose of planarization and densification can be performed. At this time, the thermal process proceeds at a temperature ranging from about 400° C. to about 800° C. in an atmosphere of nitrogen ($N_2$), oxygen ($O_2$), argon (Ar), helium (He), neon (Ne), krypton (Kr) or ozone ($O_3$) for about 1 second to about 2 hours.

Next, the first inter-layer insulation layer 34 is etched to form a storage node contact hole 35 exposing a predetermined portion of the impurity junction region 33. A titanium (Ti) layer 36 and a first titanium nitride (TiN) layer 37 are sequentially deposited as a barrier metal layer on a structure including the first inter-layer insulation layer 34 and the storage node contact hole 35. At this time, the titanium layer 36 is deposited to a thickness ranging from about 10 Å to about 500 Å, while the first titanium nitride layer 37 is deposited to a thickness ranging from about 50 Å to about 1000 Å. The titanium layer 36 and the first titanium nitride layer 37 are formed by employing one of a physical vapor deposition (PVD) technique, a chemical vapor deposition (PVD) technique and an atomic layer deposition (ALD) technique.

Afterwards, a rapid thermal annealing (RTA) process is performed to form a titanium silicide ($TiSi_x$) layer 38 on between the impurity junction region 33 and the titanium layer 36. Herein, the titanium silicide layer 38 is for forming an ohmic contact. Preferably, the RTA process for forming the titanium silicide layer 38 proceeds at a temperature ranging from about 600° C. to about 1000° C. in an atmosphere of nitrogen, ammonia ($NH_3$), argon, helium, neon or krypton for about 1 second to about 10 minutes. For another method for forming the titanium silicide layer 38, a thermal process using a diffusion furnace can be performed. At this time, the thermal process proceeds for about 10 minutes to about 60 minutes.

In addition to a stack structure of the barrier metal layer including the first titanium nitride layer 37 and the titanium layer 36 for forming a silicide layer for an ohmic contact like the titanium silicide layer 38, it is still possible to employ other stack structures such as a tantalum nitride (TaN) layer and a tantalum (Ta) layer, a titanium aluminum nitride (TiAlN) layer and a titanium (Ti) layer, a tantalum silicide nitride (TaSiN) layer and a tantalum layer, a titanium silicide nitride (TiSiN) layer and a titanium layer, a tantalum aluminum nitride (TaAlN) layer and a tantalum layer, a ruthenium titanium nitride (RuTiN) layer and a titanium layer and a ruthenium tantalum nitride (RuTaN) layer and a tantalum layer.

After the formation of the titanium silicide layer 38, a second titanium nitride layer 39 is deposited as another barrier metal layer on the first titanium nitride layer 37. A tungsten (W) layer 40 is formed on the second titanium nitride layer 39 until filling the storage node contact hole 35. At this time, the second titanium nitride layer 39 serves to prevent reciprocal diffusions between tungsten from the tungsten layer 40 and silicon from the impurity junction region 33. Preferably, the second titanium nitride layer 39 has a thickness ranging from about 50 Å to about 1000 Å. The thickness of the tungsten layer 40 is dependent on the size of the plug. In case that the diameter of the plug is about 0.3 μm, the thickness of the tungsten layer 40 is preferably about 3000 Å.

Figure 4B:
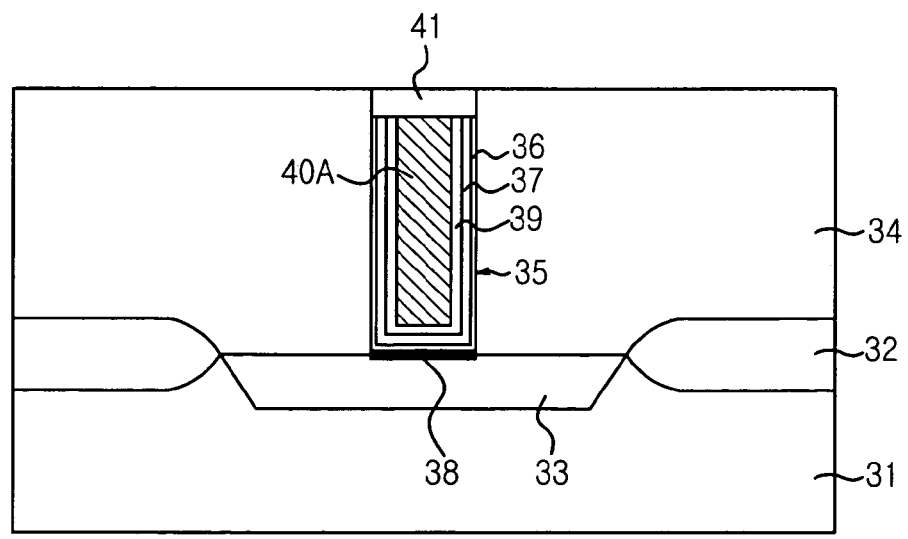

Referring to FIG. 4B, the tungsten layer 40 and the first and the second titanium nitride layers 37 and 39 are subjected to an etch-back process so to be recessed with a predetermined depth within the storage node contact hole 35. That is, after the etch-back process, a tungsten plug 40A is formed within the storage node contact hole 35 with a predetermined depth. At this time, the predetermined recess depth preferably ranges from about 500 Å to about 3000 Å.

Then, a third titanium nitride layer 41 is deposited as another barrier metal layer on the above resulting structure including the tungsten plug 40A and the first inter-layer insulation layer 34. At this time, the thickness of the third titanium nitride layer 41 is determined by the predetermined recess depth. Preferably, in case that the recess depth is about 1000 Å, the third titanium nitride layer 41 is deposited to a thickness greater than about 1500 Å under consideration of process margins.

After the deposition of the third titanium nitride layer 41, a chemical mechanical polishing (CMP) process is performed until a surface of the first inter-layer insulation layer 34 is exposed. After the CMP process, the third titanium nitride layer 41 remains only on the tungsten plug 40A within the storage node contact hole 35.

Eventually, a storage node contact includes the tungsten plug 40A and a triple barrier metal layer structure including the first titanium nitride layer 37, the second titanium nitride layer 39 and the third titanium nitride layer 41. In addition to the use of titanium nitride as the last barrier metal layer formed on the tungsten plug 40A within the storage node contact hole 35, such materials as tantalum nitride, titanium aluminum nitride, titanium silicon nitride, tantalum silicon nitride, ruthenium titanium nitride, tantalum aluminum nitride, ruthenium tantalum nitride, chromium titanium nitride (CrTiN) and chromium tantalum nitride (CrTaN) can be also used.

Figure 4C:
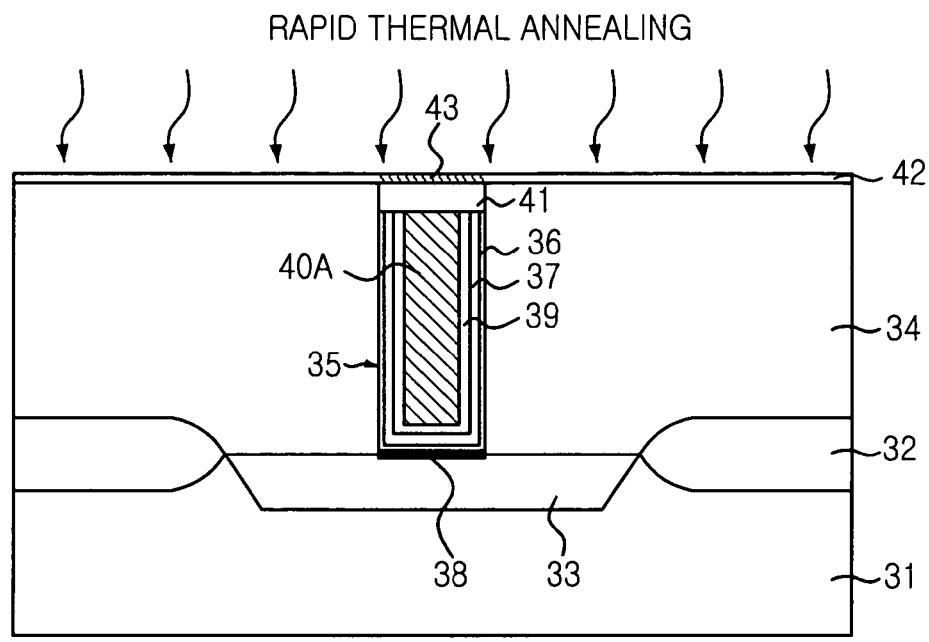

Referring to FIG. 4C, an adhesion layer 42 is formed on the resulting planarized structure including the first inter-layer insulation layer 34 and the third titanium nitride layer 41. At this time, the adhesion layer 42 is made of alumina ($Al_2O_3$) and has a thin thickness ranging from about 10 Å to about 500 Å. The reason for forming the adhesion layer 42 with the thin thickness is to remove the adhesion layer 42 through a thermal process without performing an etching process. That is, this mentioned thickness is a thickness sufficient for providing an adhesion property. Also, the adhesion layer 42 is made of a material such as titanium oxide ($TiO_2$) and tantalum oxide ($TaO_2$).

Next, a rapid thermal annealing (RTA) process is performed to make a predetermined portion of the adhesion layer 42 disposed above the tungsten plug 40A be cracked. At this time, the RTA process proceeds at a temperature ranging from about 400° C. to about 1000° C. in an atmosphere of $N_2$ or Ar gas. This process conditions prevents oxidation of the tungsten plug 40A. The cracked predetermined portion of the adhesion layer 42 is denoted as the reference number 43 in FIG. 4C.

The crack is introduced only at the predetermined region 43 disposed above the upper part of the tungsten plug 40A since the thermal expansion coefficient of tungsten is about 10 times greater than that of silicon oxide ($SiO_x$) used for the first inter-layer insulation layer 34.

In more detail, the thermal expansion coefficient of tungsten and that of silicon oxide are about $4\times10^{-6}\ k^{-1}$ and about $0.5\times10^{-6}\ k^{-1}$, respectively. Thus, during the RTA process, the tungsten plug 40A is expanded and exerts stress to the third titanium nitride layer 41 and the adhesion layer 42. As a result of this stress, the crack is introduced only at the predetermined portion 43 of the adhesion layer 42. Concurrently, the first inter-layer insulation layer 34 can be expanded during the RTA process. However, since its thermal coefficient is significantly smaller than that of the tungsten plug 40A, the crack does not take place at other portions of the adhesion layer 42 disposed over the first inter-layer insulation layer 34. As a reference, the thermal expansion coefficient of the alumina used for the adhesion layer 42 is about $6.5\times10^{-6}\ k^{-1}$, and that of the third titanium nitride layer 41 is about $9.3\times10^{-6}\ k^{-1}$.

Figure 4D:
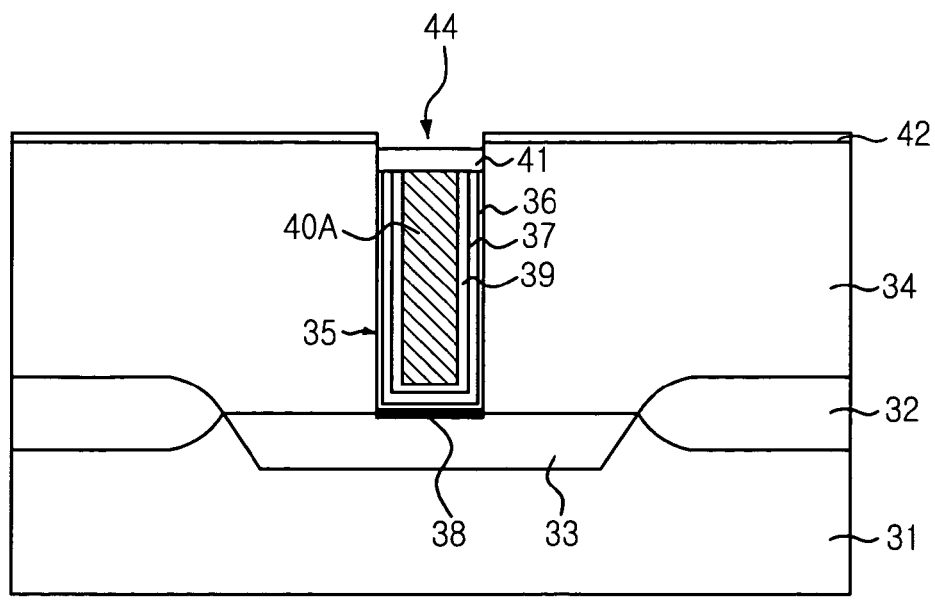

Referring to FIG. 4D, a cleaning process is performed for about 1 minute to about 60 minutes by employing a chemical solution SC-1 obtained by mixing ammonium hydroxide ($NH_4OH$), hydrogen peroxide ($H_2O_2$) and water ($H_2O$) in a ratio of about 1 to about 4 to about 20. In addition to the use of the chemical solution SC-1, it is still possible to use a sulfuric acid-peroxide mixture (SPM) solution, which is a mixture of sulfuric acid ($H_2SO_4$) and hydrogen peroxide ($H_2O_2$). At this time, for the cleaning process using the SC-1 solution, etch rates of the third titanium nitride layer 41, the adhesion layer 42 and first inter-layer insulation layer 34 are about 20 Å per minute, about 5 Å per minute and about 5 Å per minute, respectively. Particularly, the etch rate of the cracked predetermined portion 43 is higher than that of the uncracked portions of the adhesion layer 42.

Therefore, since the chemical solution SC-1 is not capable of etching the first inter-layer insulation layer 34 but capable of etching titanium nitride (TiN), it is possible to selectively remove the cracked predetermined portion 43 of the adhesion layer 42 and the third titanium nitride layer 41.

After the cleaning process, a junction region between a subsequent bottom electrode and the tungsten plug 40A, e.g., a surface of the third titanium nitride layer 41, is opened. Herein, this opened portion is denoted as 44 in FIG. 4D. At this time, the opened portion 44 is partially etched by the chemical solution SC-1, being depressed downwards. That is, the chemical solution SC-1 penetrates into the cracked predetermined portion 43 to thereby partially etch the third titanium nitride layer 41.

Figure 4E:
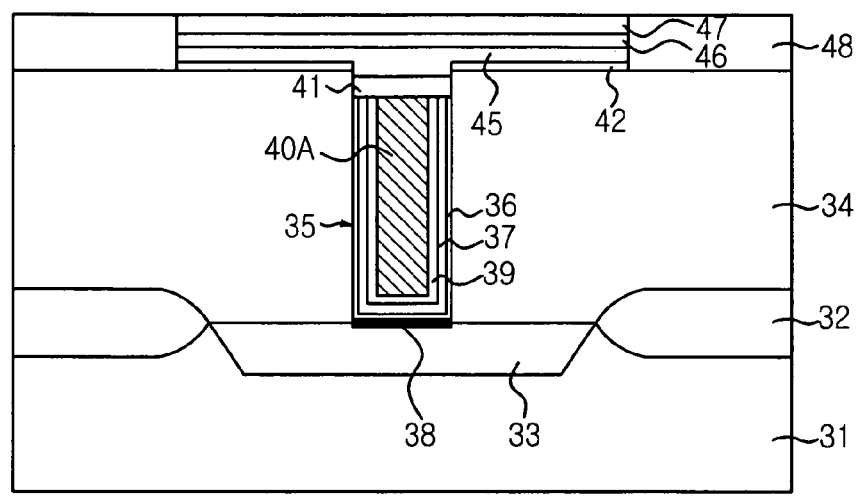

Referring to FIG. 4E, an iridium layer 45, an iridium oxide layer 46 and a platinum layer 47 are sequentially deposited on the above etched adhesion layer 42 by employing one of a PVD technique, a CVD technique and an ALD technique. At this time, the iridium layer 45 has a thickness ranging from about 100 Å to about 2000 Å. The iridium oxide layer 46 is deposited to a thickness ranging from about 10 Å to about 500 Å. The platinum layer 47 has a thickness ranging from about 100 Å to about 2000 Å. Particularly, the iridium layer 45 serves a function to prevent oxygen from being diffused in a vertical direction. In addition to the use of the iridium layer 45 for such function, it is still possible to use ruthenium titanium nitride (RuTiN), chromium titanium nitride (CrTiN), chromium tantalum nitride (CrTaN) and ruthenium tantalum nitride (RuTaN).

Next, the platinum layer 47, the iridium oxide layer 46, the iridium layer 45 and the adhesion layer 42 are sequentially etched to form a bottom electrode. Eventually, the bottom electrode having a stack structure including the platinum layer 47, the iridium oxide layer 46 and the iridium layer 45 is formed on the opened upper part of the tungsten plug 40A. The adhesion layer 42 remains on between the iridium layer 45 of the bottom electrode and the first inter-layer insulation layer 34. At this time, the iridium oxide layer 46 and the iridium layer 45 serves as an oxidation barrier layer for preventing the tungsten plug 40A from being oxidated. Such materials as ruthenium titanium nitride (RuTiN), chromium titanium nitride (CrTiN), ruthenium tantalum nitride (RuTaN) and chromium tantalum nitride (CrTaN) can be also used as the oxidation barrier layer.

Subsequent to the formation of the bottom electrode, a second inter-layer insulation layer 48 is deposited on an entire surface of the resulting structure including the bottom electrode. The second inter-layer insulation layer 48 is then planarized until a surface of the platinum layer 47 is exposed, so that the second inter-layer insulation layer 48 encompasses the bottom electrode. For the above planarization process, a CMP process or an etch-back process can be used. Also, the planarization takes place in two steps by performing initially the CMP process and subsequently performing the etch-back process. For instance, in case of the two step planarization, the CMP process proceeds until the second inter-layer insulation layer 48 remains on the platinum layer 47 with a predetermined thickness. Then, the etch-back process is performed until the surface of the platinum layer 47 is exposed. This two step planarization protects the platinum layer 47 against damages such as scratch shown when only the CMP process is employed.

The second inter-layer insulation layer 48 is made of one of HDP oxide, BPSG, PSG, MTO, HTO and TEOS oxide and is deposited to a thickness ranging from about 3000 Å to about 30000 Å by using one of a PVD technique, a CVD technique, an ALD technique and a spin-on technique.

Also, the second inter-layer insulation layer 48 can be formed in double layers to reinforce thermal stability and the function as the oxygen barrier layer. An oxygen barrier layer made of a material having a good oxygen barrier property such as alumina ($Al_2O_3$), silicon nitride ($Si_3N_4$) and silicon oxynitride (SiON) is first deposited. Then, a layer made of a material such as HDP oxide, BPSG, PSG, MTO, HTO and TEOS oxide is deposited thereon. Herein, the oxygen barrier layer remains such that it encompasses the bottom electrode to thereby prevent oxygen from being diffused into the bottom electrode during a subsequent thermal process as simultaneously as to prevent oxygen from being diffused into regions below the bottom electrode.

It is possible to perform a thermal process to additionally planarize and densify the second inter-layer insulation layer 48 and to remove moisture. At this time, the thermal process proceeds at a temperature ranging from about 400° C. to about 800° C. in an atmosphere of $N_2$, $O_2$, He, Kr or $O_3$ for about 1 second to about 2 hours.

Figure 4F:
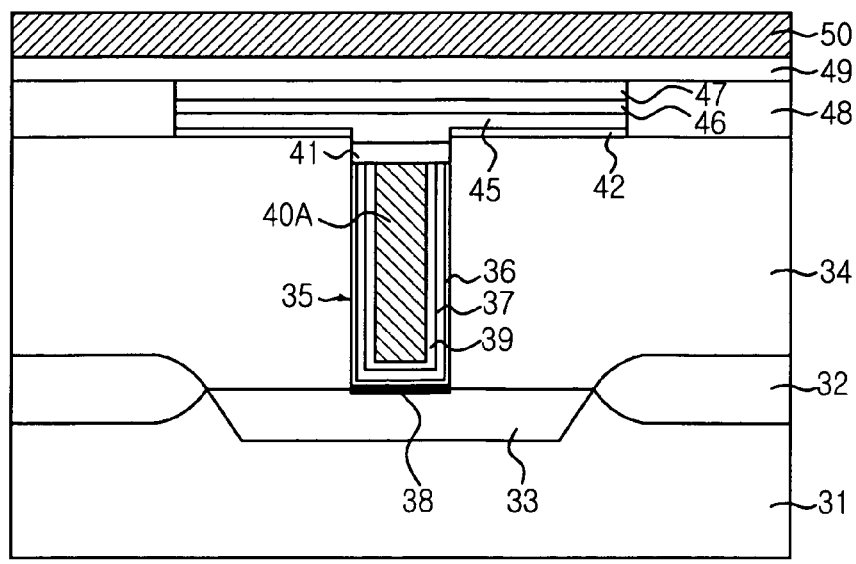

Referring to FIG. 4F, a ferroelectric layer 49 is deposited on the second inter-layer insulation layer 48 and the exposed platinum layer 47. At this time, the ferroelectric layer 49 is deposited to a thickness ranging from about 50 Å to about 2000 Å by employing one of a CVD technique, an ALD technique, a metal organic deposition (MOD) technique and a spin coating technique. The ferroelectric layer 49 is made of one of a material selected from a group consisting of strontium bismuth tantalate (SBT), lead zirconate titanate (PZT) and bismuth lanthanum titanate (BLT) and a material selected from a group consisting of impurity added or composition ratio changed SBT, PZT, BLT and strontium bismuth tantalum niobate (SBTN).

An upper electrode 50 is formed on the ferroelectric layer 49. At this time, the upper electrode 50 can be formed in a single layer made of a material such as Pt, Ir, Ru, $IrO_2$ and ruthenium oxide ($RuO_2$) or in stacked layers such as $Pt/IrO_2$, $Pt/IrO_2/Ir$, $IrO_2/Ir$, $RuO_2/Ru$, $Pt/RuO_2/Ru$ and $Pt/RuO_2$.

After the formation of the upper electrode 50, a high thermal process is performed to crystallize the ferroelectric layer 49.

Figure 4G:
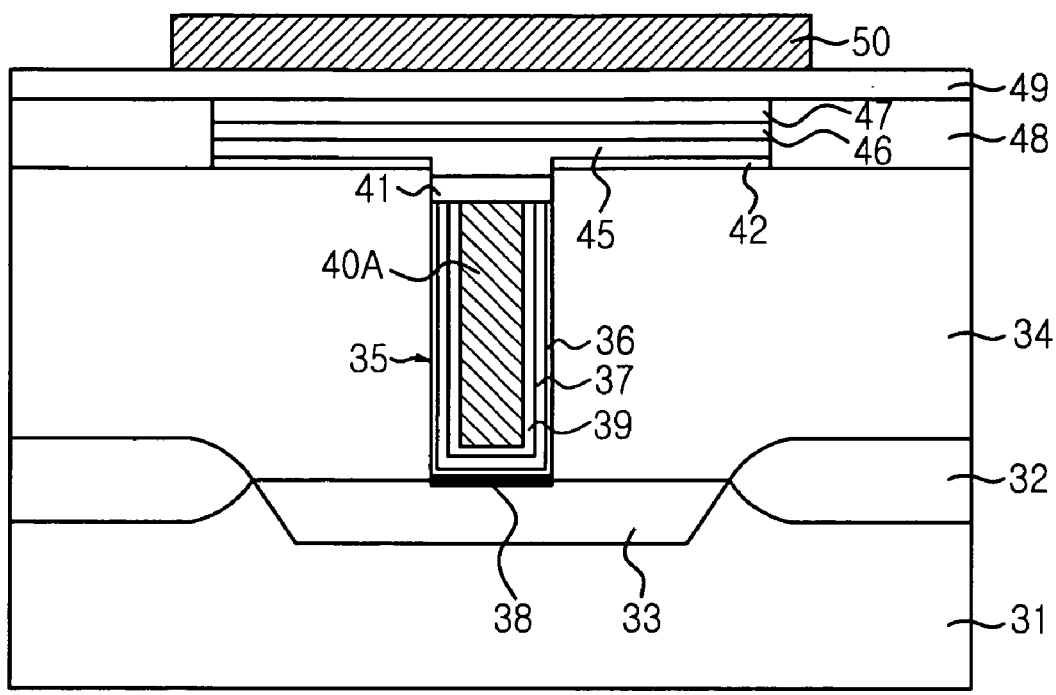

Referring to FIG. 4G, the upper electrode 50 and the ferroelectric layer 49 are simultaneously etched, or the upper electrode 50 is first etched and predetermined portions of the ferroelectric layer 49 are selectively etched. After the etching process, a recovery thermal process proceeds to recover the ferroelectric layer 49 damaged during the above etching process.

On the basis of the first preferred embodiment of the present invention, the adhesion layer 42 disposed on the upper part of the tungsten plug 40A can be removed without performing an additional masking and etching process for opening the predetermined portion of the adhesion layer, that a sufficient process margin is secured. As a result, an adhesion area between the bottom electrode and the adhesion layer 42 is increased, and thereby minimizing the oxygen diffusion during the thermal process. Accordingly, it is possible to prevent the oxidation of the third titanium nitride layer 41 caused by the diffused oxygen.

Figure 5:
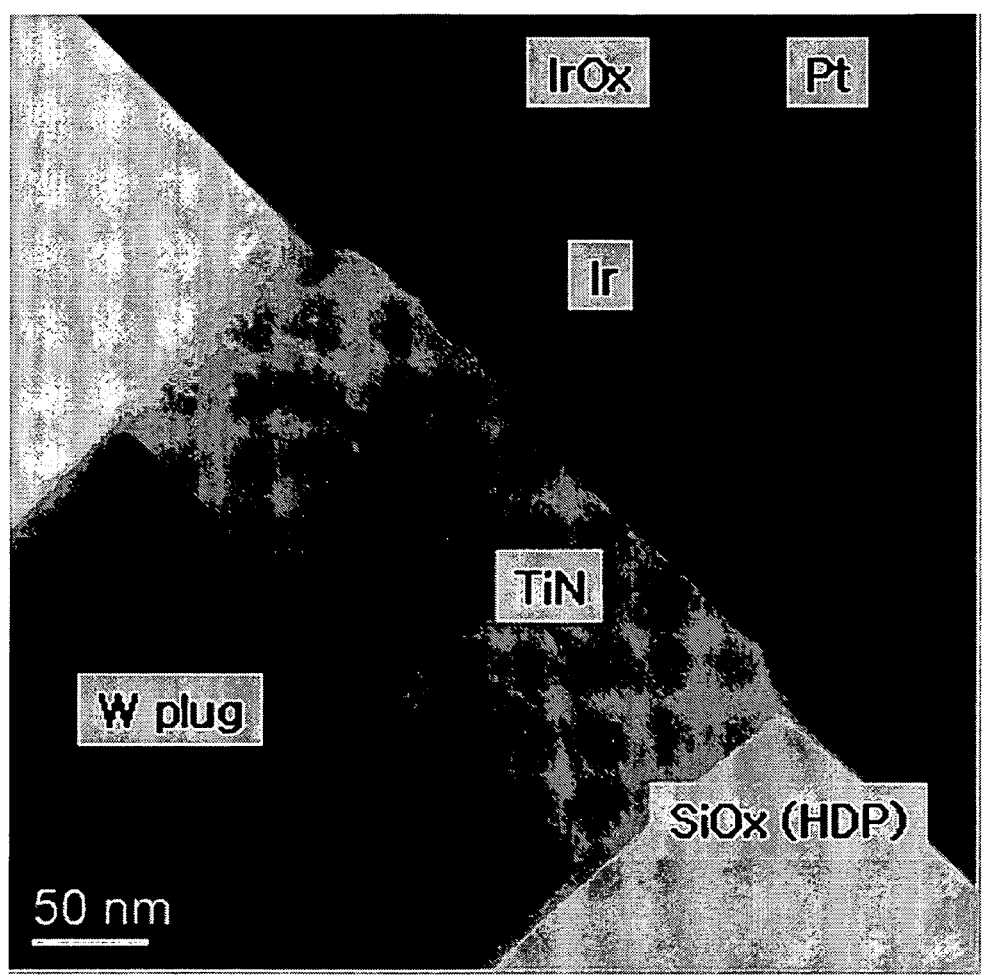
FIG. 5 is a micrograph showing a ferroelectric layer after a recovery thermal process in accordance with the first preferred embodiment of the present invention.

FIG. 5 is a micrograph showing the ferroelectric layer after the recovery thermal process in accordance with the first preferred embodiment of the present invention. In FIG. 5, the third titanium nitride layer has a thickness of about 1000 Å. The adhesion layer made of alumina has a thickness of about 10 Å. The iridium layer, the iridium oxide layer, the platinum layer, the ferroelectric layer made of BLT and the upper electrode made of Pt have a thickness of about 1000 Å, about 100 Å, about 1000 Å, about 1000 Å and about 1500 Å, respectively.

As shown, the bottom electrode is electrically connected to the tungsten plug through the cracked predetermined portion formed based on a difference in the thermal expansion coefficients even without performing the additional masking and etching process for the adhesion layer. It is also shown that the third titanium nitride layer is not oxidized since the oxygen is suppressed from being diffused in a vertical direction by maximally securing the adhesion layer at an interface between the bottom electrode and the first inter-layer insulation layer.

Figure 1A:
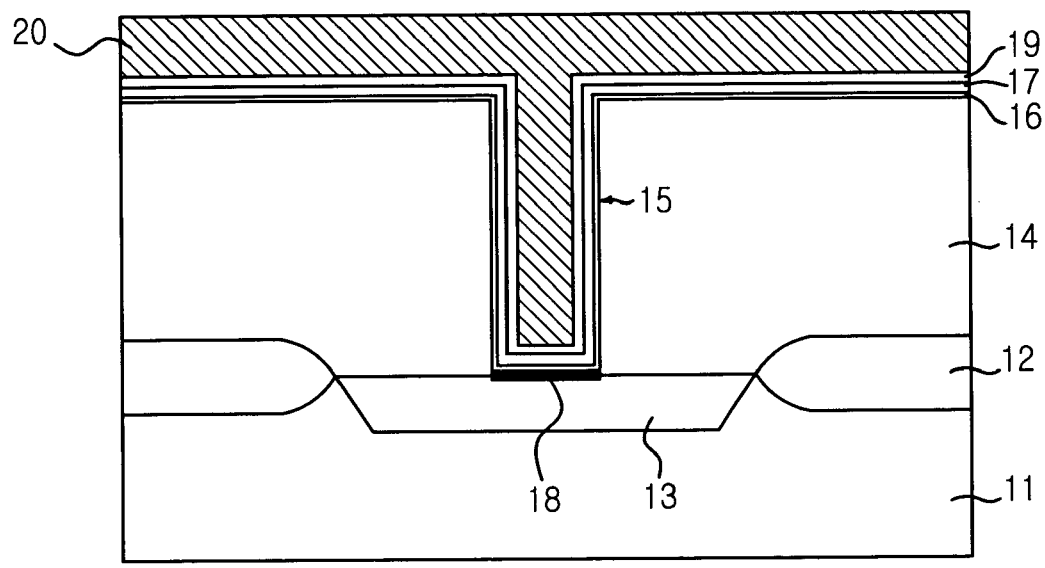
FIGS. 1A to 1E are cross-sectional views illustrating a conventional method for fabricating a ferroelectric random access memory (FeRAM) device.
Figure 1B:
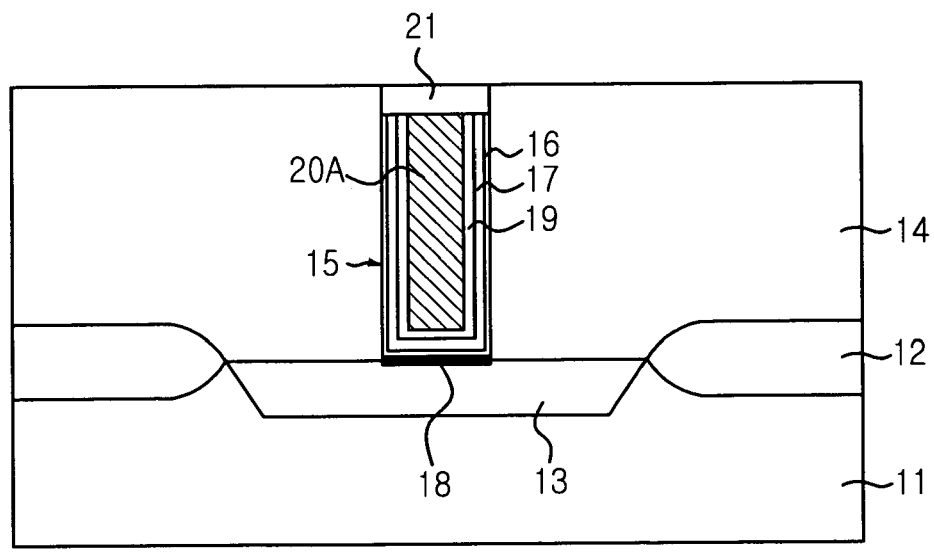
Figure 1C:
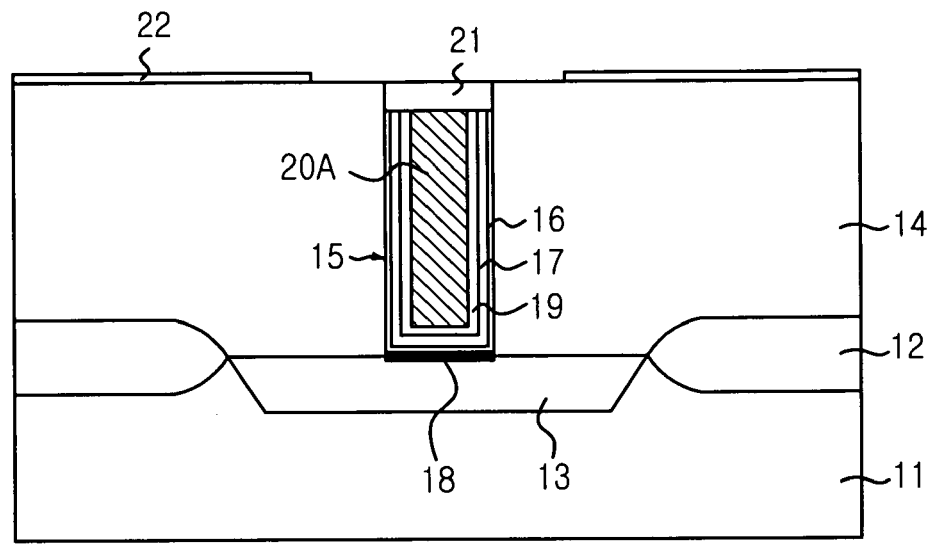
Figure 1D:
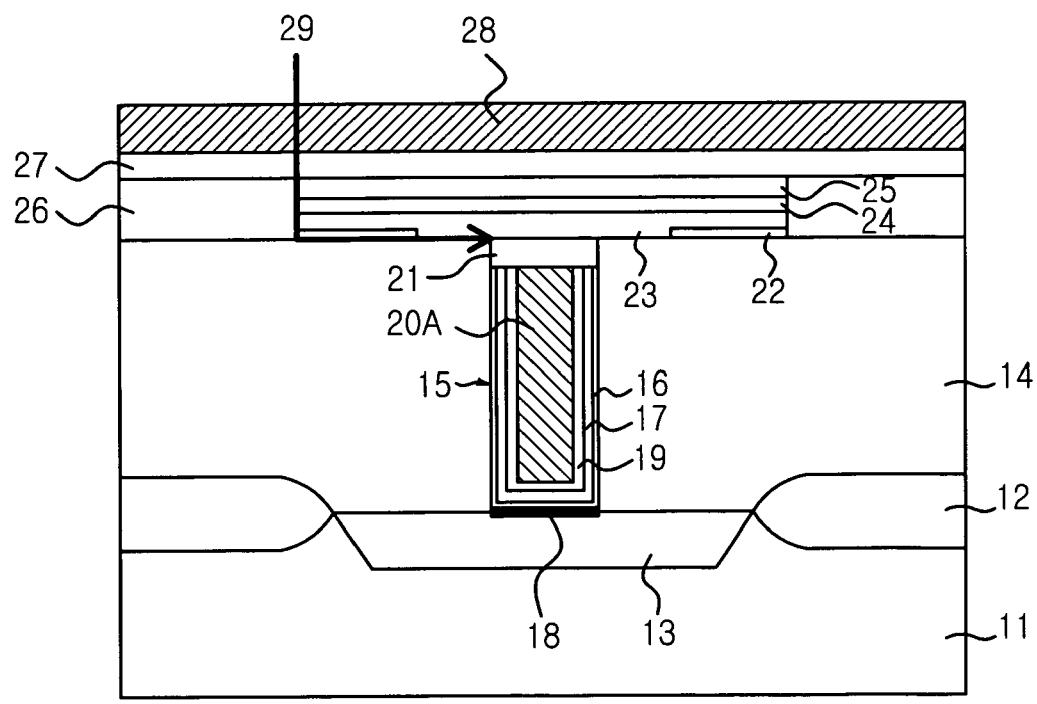
Figure 1E:
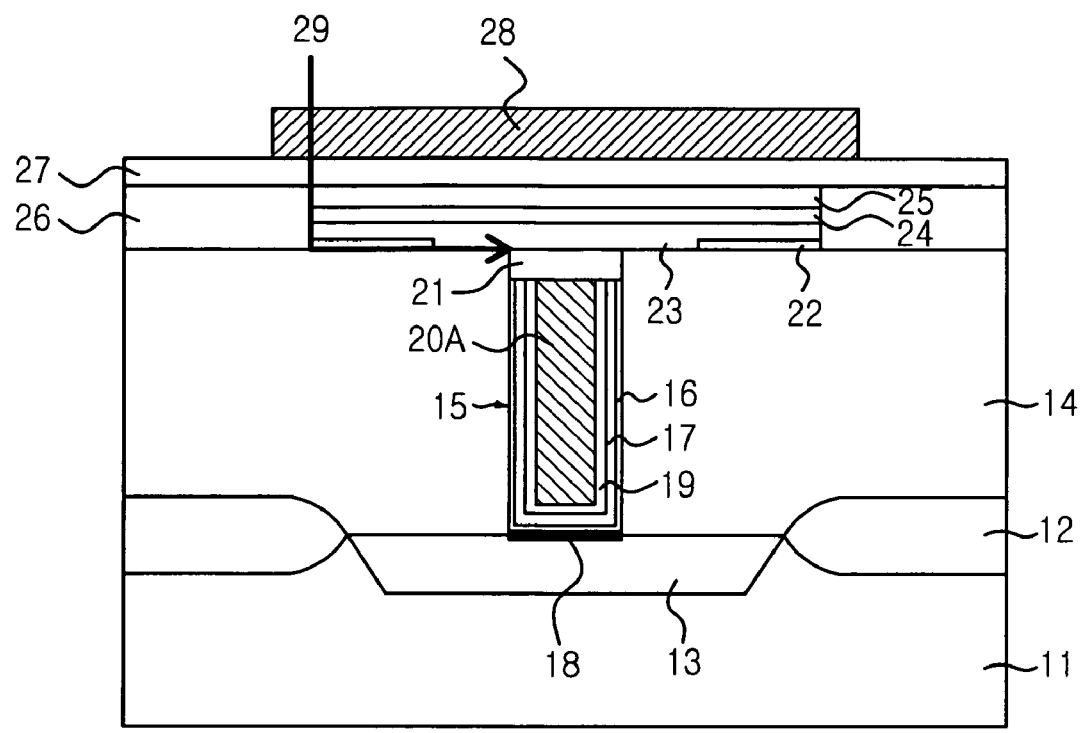
Figure 2:
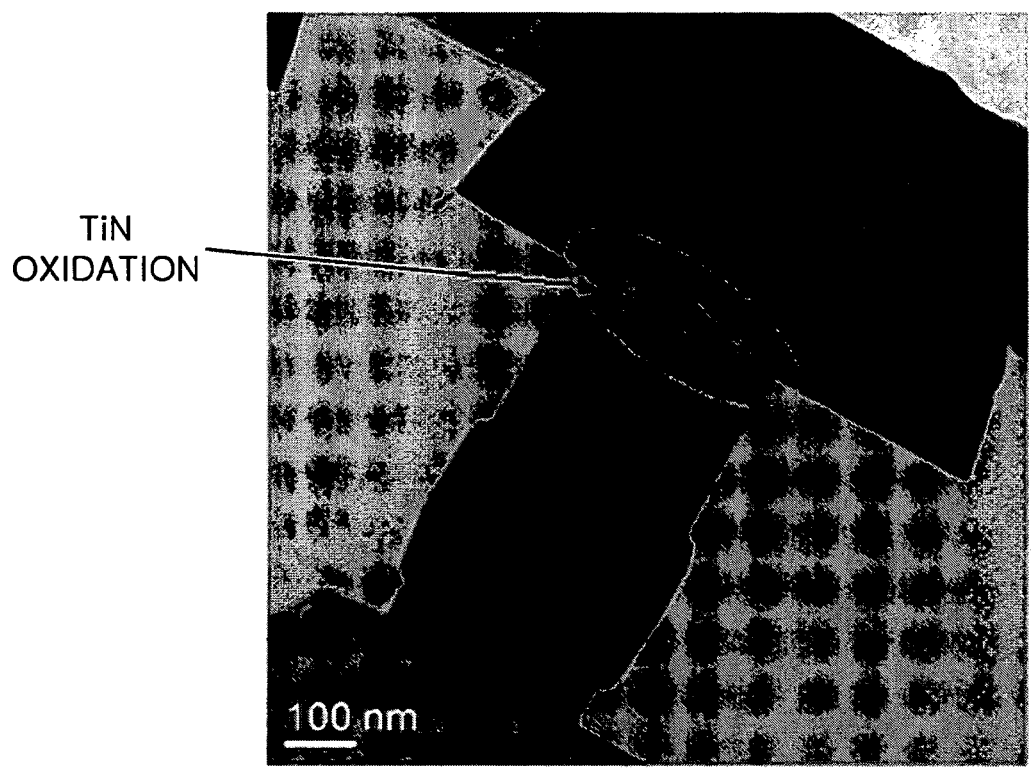
FIG. 2 is a micrograph of transmission electron microscopy (TEM) showing a titanium nitride layer after a thermal process for crystallizing a ferroelectric layer according to the conventional method.
Figure 3:
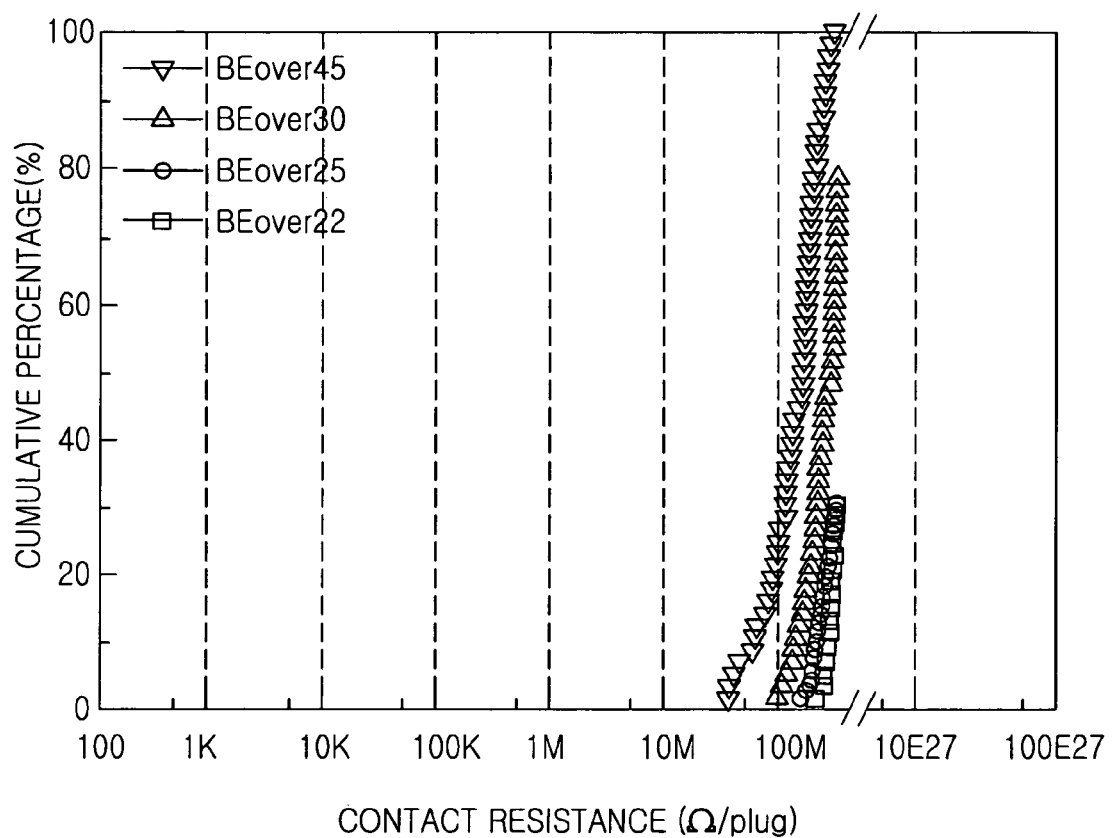
FIG. 3 is a graph showing measured contact resistance values when the conventional method is employed.
Figure 6:
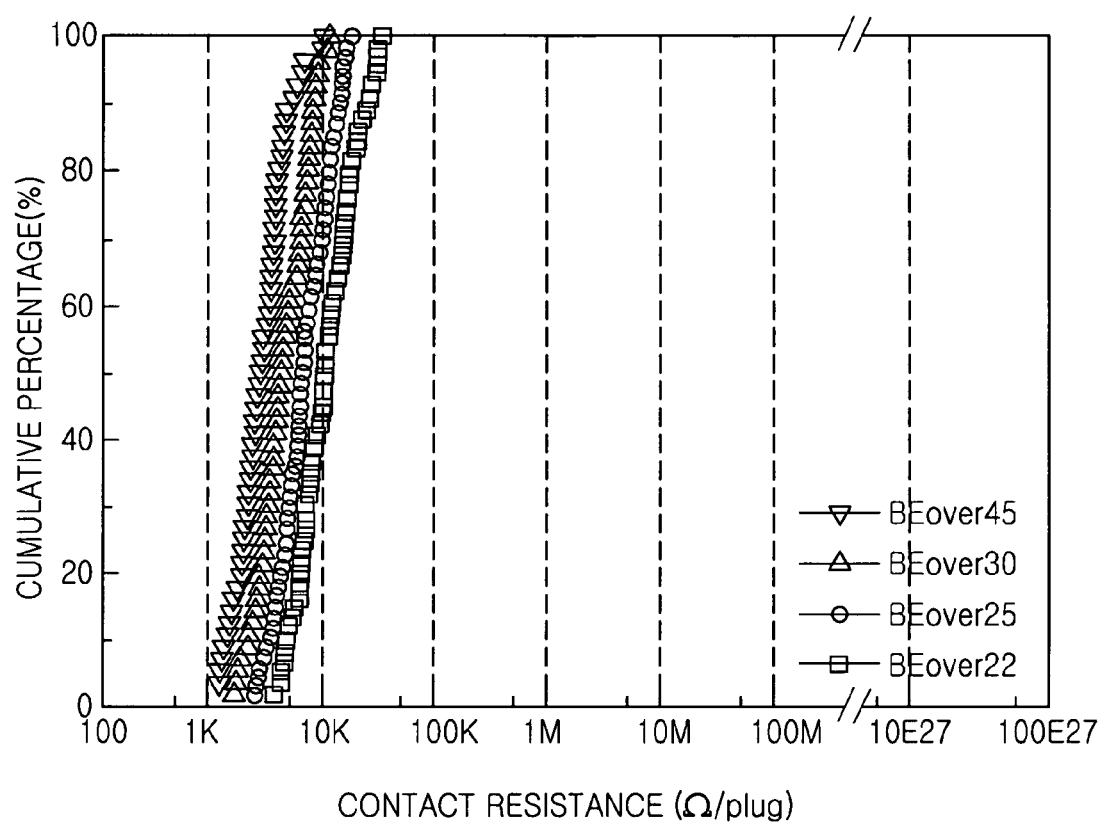
FIG. 6 is a graph showing measured contact resistance values in accordance with the first preferred embodiment of the present invention.

FIG. 6 is a graph showing measured contact resistance values in accordance with the first preferred embodiment of the present invention. The same reference symbols used in FIG. 3 are used in FIG. 6, and the same detailed descriptions on such reference symbols are omitted.

As shown, the contact resistance values are low by ranging from about 1 KΩ to about 10 KΩ. The greater the overlap between the storage node contact and the bottom electrode is, the smaller the contact resistance is.

FIGS. 7A to 7H are cross-sectional views illustrating a method for fabricating a FeRAM device in accordance with a second preferred embodiment of the present invention.

Figure 7A:
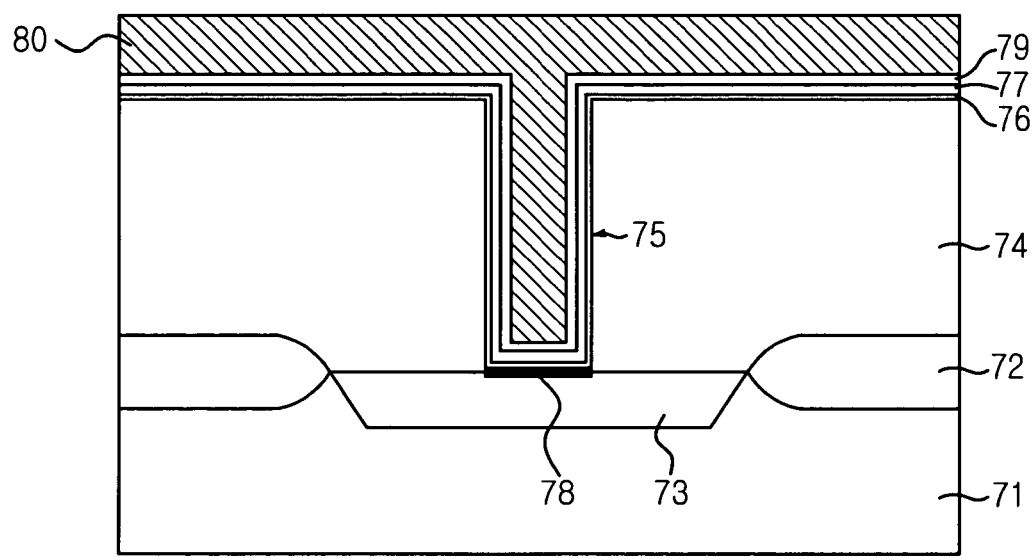
FIGS. 7A to 7H are cross-sectional views illustrating a method for fabricating a FeRAM device in accordance with a second preferred embodiment of the present invention.

Referring to FIG. 7A, field oxide layers 72 are formed in a substrate 71, and an impurity junction region 73 such as a source/drain region of a transistor is formed in the substrate 71. Then, a first inter-layer insulation layer 74 is formed on the substrate 71. At this time, the first inter-layer insulation layer 74 has a multi-layer structure to insulate a word line, a landing plug and a bit line before forming a storage node contact. Preferably, the first inter-layer insulation layer 74 is made of a material selected from a silicon oxide group consisting of HDP oxide, BPSG, PSG, MTO, HTO and TEOS oxide. After the deposition of the first inter-layer insulation layer 74, a chemical mechanical polishing (CMP) process for the purpose of planarization or a thermal process for the purpose of planarization and densification can be performed. At this time, the thermal process proceeds at a temperature ranging from about 400° C. to about 800° C. in an atmosphere of $N_2$, $O_2$, Ar, He, Ne, Kr or $O_3$ for about 1 second to about 2 hours.

Next, the first inter-layer insulation layer 74 is etched to form a storage node contact hole 75 exposing a predetermined portion of the impurity junction region 73. A titanium layer 76 and a first titanium nitride layer 77 are sequentially deposited as a barrier metal layer on a structure including the first inter-layer insulation layer 74 and the storage node contact hole 75. At this time, the titanium layer 76 is deposited to a thickness ranging from about 10 Å to about 500 Å, while the first titanium nitride layer 77 is deposited to a thickness ranging from about 50 Å to about 1000 Å. The titanium layer 76 and the first titanium nitride layer 77 are formed by employing one of a PVD technique, a PVD technique and an ALD technique.

Afterwards, a RTA process is performed to form a titanium silicide layer 78 on between the impurity junction region 73 and the titanium layer 76. Herein, the titanium silicide layer 78 is for forming an ohmic contact. Preferably, the RTA process for forming the titanium silicide layer 78 proceeds at a temperature ranging from about 600° C. to about 1000° C. in an atmosphere of $N_2$, $NH_3$, Ar, He, Ne or Kr for about 1 second to about 10 minutes. For another method for forming the titanium silicide layer 78, a thermal process using a diffusion furnace can be performed. At this time, the thermal process proceeds for about 10 minutes to about 60 minutes.

In addition to a stack structure of the barrier metal layer including the first titanium nitride layer 77 and the titanium layer 76 for forming a silicide layer for an ohmic contact like the titanium silicide 78, it is possible to use other stack structures such as a TaN layer and a Ta layer, a TiAlN layer and a Ti layer, a TaSiN layer and a Ta layer, a TiSiN layer and a Ti layer, a TaAlN layer and a Ta layer, a RuTiN layer and a Ti layer and a RuTaN layer and a Ta layer.

After the formation of the titanium silicide layer 78, a second titanium nitride layer 79 is deposited as another barrier metal layer on the first titanium nitride layer 77. A tungsten layer 80 is formed on the second titanium nitride layer 79 until filling the storage node contact hole 75. At this time, the second titanium nitride layer 79 serves to prevent reciprocal diffusions between tungsten from the tungsten layer 80 and silicon from the impurity junction region 73. Preferably, the second titanium nitride layer 79 has a thickness ranging from about 50 Å to about 1000 Å. The thickness of the tungsten layer 80 is dependent on the size of the plug. In case that the diameter of the plug is about 0.3 μm, the thickness of the tungsten layer 80 is preferably about 3000 Å.

Figure 7B:
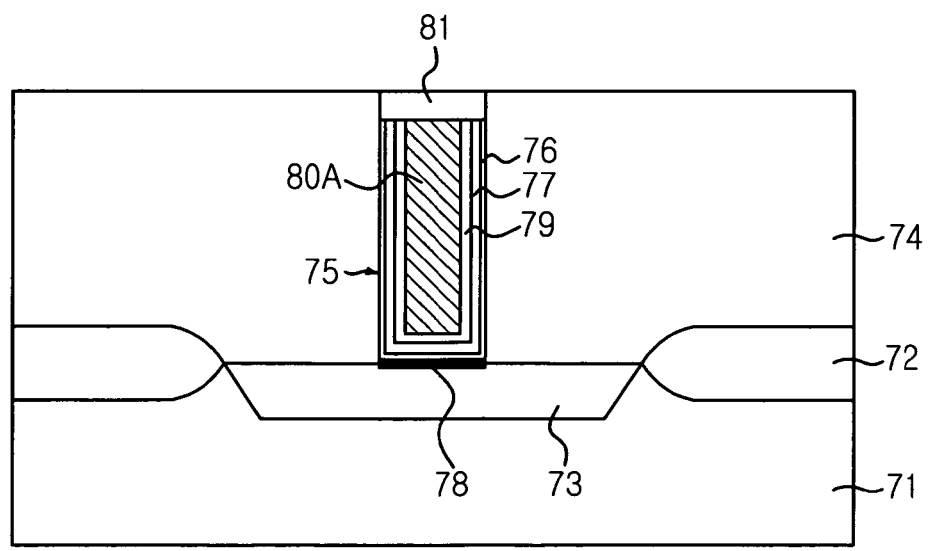

Referring to FIG. 7B, the tungsten layer 80 and the first and the second titanium nitride layers 77 and 79 are subjected to an etch-back process so to be recessed with a predetermined depth within the storage node contact hole 75. That is, after the etch-back process, a tungsten plug 80A is formed within the storage node contact hole 75 with a predetermined depth. At this time, the predetermined recess depth preferably ranges from about 500 Å to about 3000 Å.

Then, a third titanium nitride layer 81 is deposited as another barrier metal layer on the above resulting structure including the tungsten plug 80A and the first inter-layer insulation layer 74. At this time, the thickness of the third titanium nitride layer 81 is determined by the predetermined recess depth. Preferably, if the recess depth is about 1000 Å, the third titanium nitride layer 81 is deposited to a thickness greater than about 1500 Å.

After the deposition of the third titanium nitride layer 81, a chemical mechanical polishing (CMP) process is performed until a surface of the first inter-layer insulation layer 74 is exposed. After the CMP process, the third titanium nitride layer 81 remains only on the tungsten plug 80A within the storage node contact hole 75.

Eventually, the storage node contact includes the tungsten plug 80A and a triple barrier metal layer structure including the first titanium nitride layer 77, the second titanium nitride layer 79 and the third titanium nitride layer 81. In addition to the use of titanium nitride as the last barrier metal layer formed on the tungsten plug 80A within the storage node contact hole 75, such materials as TaN, TiAlN, TiSiN, TaSiN, RuTiN, TaAlN, RuTaN, CrTiN and CrTaN can be also used.

Figure 7C:
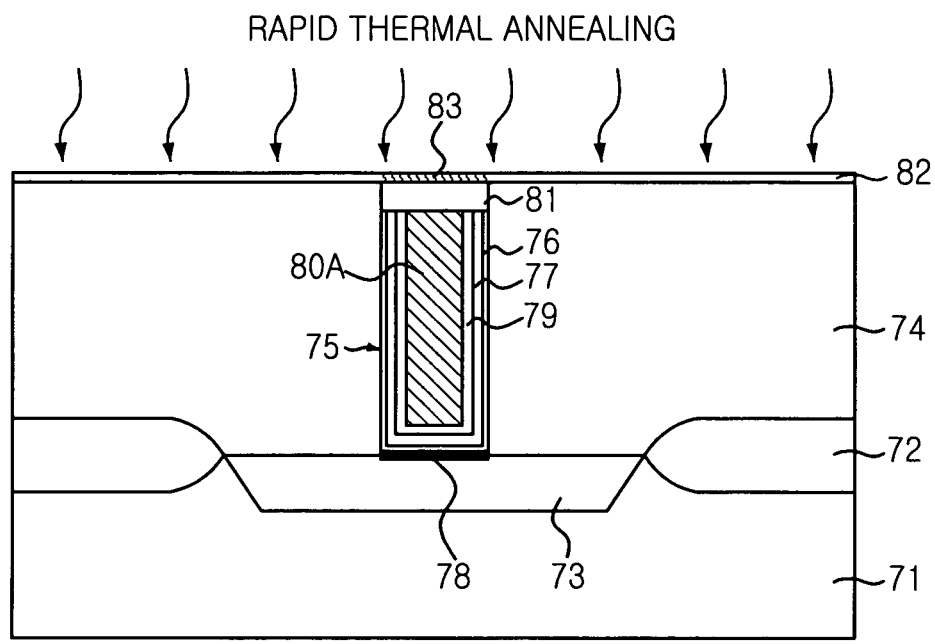

Referring to FIG. 7C, an adhesion layer 82 is formed on the resulting planarized structure including the first inter-layer insulation layer 74 and the third titanium nitride layer 81. At this time, the adhesion layer 82 is made of $Al_2O_3$ and has a thin thickness ranging from about 10 Å to about 500 Å. The reason for forming the adhesion layer 82 with the thin thickness is to remove the adhesion layer 82 through a thermal process without performing an etching process. That is, this mentioned thickness is a thickness sufficient for providing an adhesion property. Also, the adhesion layer 82 is made of a material such as $TiO_2$ and $TaO_2$.

Next, a RTA process is performed to make a predetermined portion 83 of the adhesion layer 82 disposed above the tungsten plug 80A and the third titanium nitride layer 81 be cracked. At this time, the RTA process proceeds at a temperature ranging from about 400° C. to about 1000° C. in an atmosphere of $N_2$ and Ar gas. This process conditions prevents oxidation of the tungsten plug 80A. The cracked predetermined portion 83 of the adhesion layer 82 is denoted as the reference number 83 in FIG. 7C.

The cracked predetermined portion 83 is introduced only at a predetermined region, i.e., a region above an upper part of the tungsten plug 80A and the third titanium nitride layer 81 since the thermal expansion coefficient of tungsten is about 10 times greater than that of silicon oxide ($SiO_x$) used for the first inter-layer insulation layer 74.

In more detail, the thermal expansion coefficient of tungsten and that of silicon oxide are about $4 \times 10^{-6}$ $k^{-1}$ and about $0.5 \times 10^{-6}$ $k^{-1}$. Thus, during the RTA process, the tungsten plug 80A is expanded and exerts stress to the third titanium nitride layer 81 and the adhesion layer 82. As a result of this stress, the crack takes place only at the predetermined portion 83 of the adhesion layer 82. Concurrently, the first inter-layer insulation layer 74 can be expanded during the RTA process. However, since its thermal coefficient is significantly smaller than that of the tungsten plug 80A, the crack does not take place at other portions of the adhesion layer 82 disposed over the first inter-layer insulation layer 74. As a reference, thermal expansion coefficient of the alumina used for the adhesion layer 82 is about $6.5 \times 10^{-6}$ $k^{-1}$, and that of the third titanium nitride layer 81 is about $9.3 \times 10^{-6}$ $k^{-1}$.

Figure 7D:
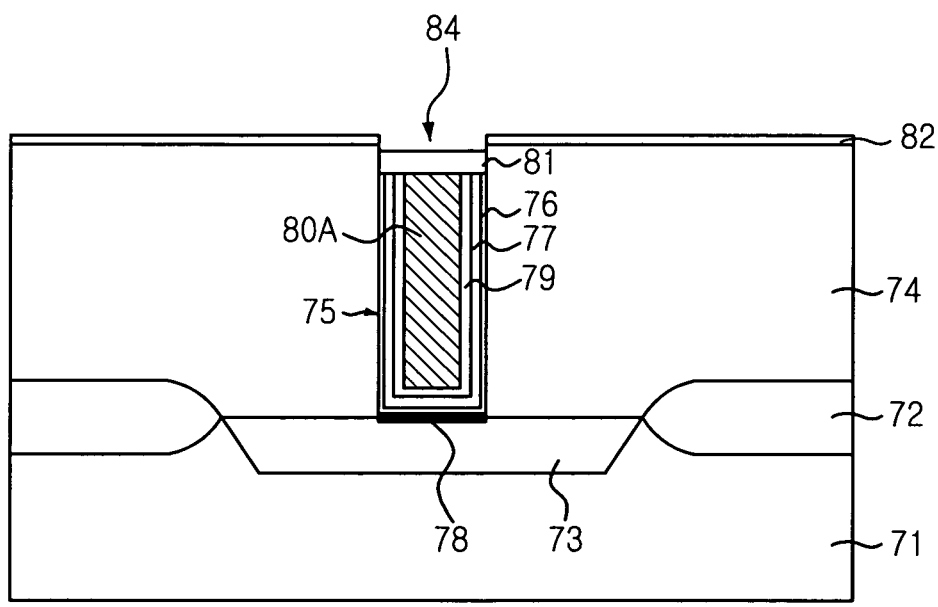

Referring to FIG. 7D, a cleaning process is performed for about 1 minute to about 60 minutes by employing a chemical solution SC-1 obtained by mixing $NH_4OH$, $H_2O_2$ and $H_2O$ in a ratio of about 1 to about 4 to about 20. In addition to the use of the chemical solution SC-1, it is still possible to use a SPM solution. At this time, for the cleaning process using the SC-1 solution, etch rates of the third titanium nitride layer 81, the adhesion layer 82 and first inter-layer insulation layer 74 are about 20 Å per minute, about 5 Å per minute and about 5 Å per minute, respectively. Particularly, the etch rate of the cracked predetermined portion 83 is higher than that of the uncracked portions of the adhesion layer 82.

Therefore, since the chemical solution SC-1 is not capable of etching the first inter-layer insulation layer 74 but capable of etching titanium nitride (TiN), it is possible to selectively remove the cracked predetermined portion 83 of the adhesion layer 82 and the third titanium nitride layer 81.

After the cleaning process, a junction region between a subsequent bottom electrode and the tungsten plug 80A, e.g., a surface of the third titanium nitride layer 81 is opened. Herein, this opened portion is denoted as 84 in FIG. 7D. At this time, the opened portion 84 is partially etched by the chemical solution SC-1, being depressed downwards. That is, the chemical solution SC-1 penetrates into the cracked predetermined portion 83 to thereby partially etch the third titanium nitride layer 81.

Figure 7E:
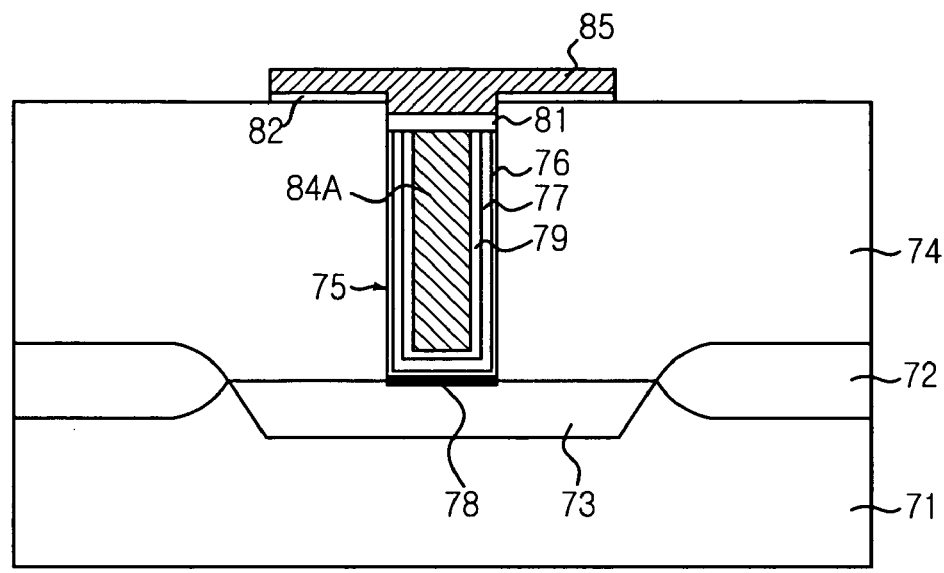

Referring to FIG. 7E, an iridium layer 85 is deposited on the etched adhesion layer 82. Then, the iridium layer 85 and the adhesion layer 82 are etched to form a first layer of a bottom electrode including the adhesion layer 82. At this time, the iridium layer 85 is deposited to a thickness ranging from about 100 Å to about 2000 Å by employing one of a PVD technique, a CVD technique and an ALD technique. Particularly, the iridium layer 85 serves a function to prevent oxygen from being diffused in a vertical direction in case that the thickness of the iridium layer 85 is greater than about 1000 Å. In addition to the use of iridium for such function, it is still possible to use RuTiN, CrTiN, CrTaN and RuTaN. Also, the adhesion layer 82 fully remains on between the iridium layer 85 of the bottom electrode and the first inter-layer insulation layer 74.

Figure 7F:
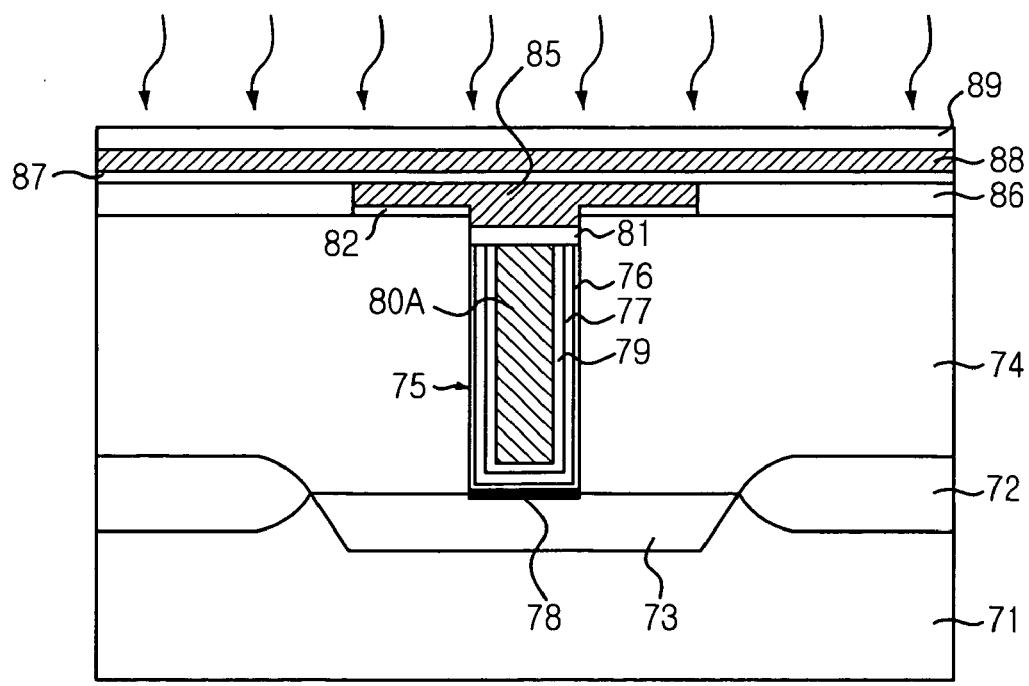

Referring to FIG. 7F, a second inter-layer insulation layer 86 is deposited on the first inter-layer insulation layer 74 and the iridium layer 85. Then, a planarization process is performed thereto until a surface of the iridium layer 85 is exposed. From this planarization process, the second inter-layer insulation layer 86 encompasses the first layer of the bottom electrode, i.e., the iridium layer 85. Herein, a CMP process or an etch-back process can be used for the above planarization process. Also, the planarization takes place in two steps by performing initially the CMP process and subsequently performing the etch-back process. For instance, in case of the two step planarization, the CMP process proceeds until the second inter-layer insulation layer 86 remains on the iridium layer 85 with a predetermined thickness. Then, the etch-back process is performed until the surface of the iridium layer 85 is exposed. This two step planarization protects the iridium layer 85 against damages such as scratch shown when only the CMP process is employed.

Herein, the second inter-layer insulation layer 86 is made of one of HDP oxide, BPSG, PSG, MTO, HTO and TEOS oxide and is deposited to a thickness ranging from about 3000 Å to about 30000 Å by using one of a PVD technique, a CVD technique, an ALD technique and a spin-on technique.

Also, the second inter-layer insulation layer 86 can be formed in double layers to reinforce thermal stability and the function as the oxygen barrier layer. An oxygen barrier layer made of a material having a good oxygen barrier property such as $Al_2O_3$, $Si_3N_4$ and SiON is first deposited. Then, a layer made of a material such as HDP oxide, BPSG, PSG, MTO, HTO and TEOS oxide is deposited thereon. Herein, the oxygen barrier layer remains such that it encompasses the iridium layer 85 of the bottom electrode to thereby prevent oxygen from being diffused into the iridium layer 85 during a subsequent thermal process as simultaneously as to prevent oxygen from being diffused into regions below the iridium layer 85.

It is possible to perform a thermal process to additionally planarize and densify the second inter-layer insulation layer 86 and to remove moisture. At this time, the thermal process proceeds at a temperature ranging from about 400° C. to about 800° C. in an atmosphere of $N_2$, $O_2$, He, Kr and $O_3$ for about 1 second to about 2 hours.

Next, an iridium oxide layer 87 and a platinum layer 88 are sequentially deposited on the planarized second inter-layer insulation layer 86 and the iridium layer 85 by employing one of a PVD technique, a CVD technique and an ALD technique. At this time, the iridium oxide layer 87 is deposited to a thickness ranging from about 10 Å to about 500 Å. The platinum layer 88 has a thickness ranging from about 100 Å to about 2000 Å. Then, a ferroelectric layer 89 is deposited on the platinum layer 88. At this time, the ferroelectric layer 89 is deposited to a thickness ranging from about 50 Å to about 2000 Å by employing one of a CVD technique, an ALD technique, a MOD technique, a sol-gel technique and a spin coating technique. Also, the ferroelectric layer 89 is made of one of a material selected from a group consisting of SBT, PZT and BLT and a material selected from a group consisting of impurity added or composition ratio changed SBT, PZT, BLT and SBTN.

Afterwards, a thermal process for crystallizing the ferroelectric layer 89 and removing impurities is performed. In case that the ferroelectric layer 89 is made of BLT, a first rapid thermal process (RTP-1) for removing organic impurities produced after the deposition of the BLT for forming the ferroelectric layer 89, a second rapid thermal process (RTP-2) for generating nuclei of the BLT and a furnace annealing process for growing grains of the BLT are sequentially performed.

For instance, a baking process proceeds at a temperature ranging from about 150° C. to about 250° C. to remove the organic impurities, and the RTP-1 is subsequently performed at a temperature of about 475° C. in an atmosphere of $O_2$ for about 60 seconds in order to remove the organic impurities. Thereafter, the RTP-2 is performed at a temperature of about 600° C. in an atmosphere of $O_2$ for about 120 seconds to grow grains of the BLT. The furnace annealing process using a diffusion furnace is then performed at a temperature of about 650° C. in an atmosphere of $O_2$ for about 60 minutes to thereby maximize the crystallization of the BLT.

As described above, the thermal process for crystallizing the ferroelectric layer 89 and removing the impurities proceeds under a state that the platinum layer 88 formed beneath the ferroelectric layer 89 covers the whole bottom electrode structure, and thus, it is possible to form the ferroelectric layer 89 maintained well with its ferroelectric characteristics.

Figure 7G:
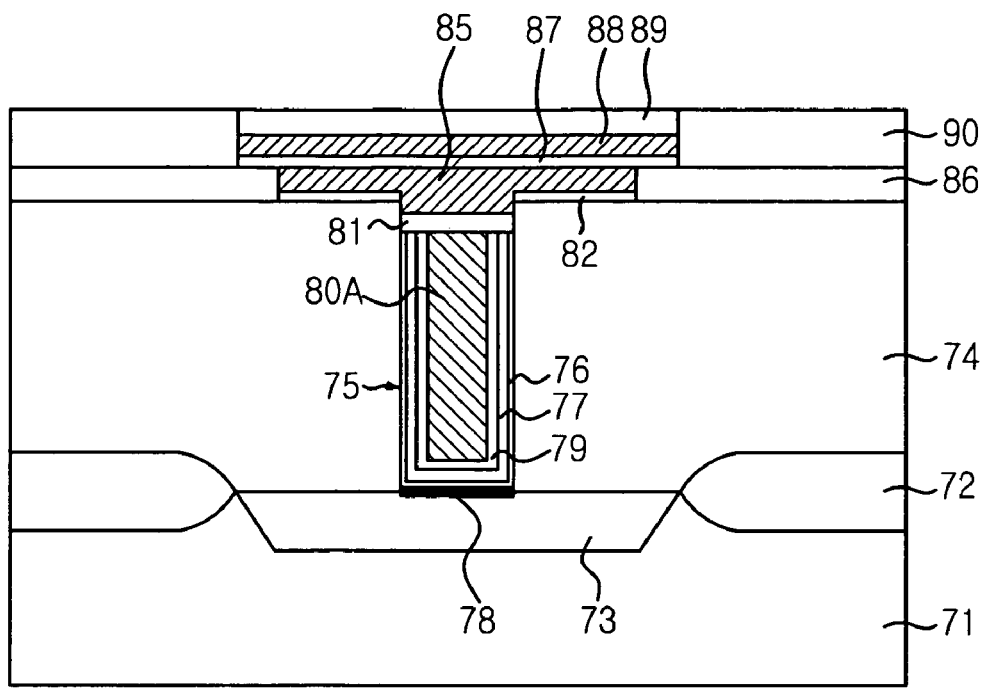

Referring to FIG. 7G, the ferroelectric layer 89, the platinum layer 88 and the iridium oxide layer 87 are simultaneously etched in a stepwise fashion to form a second layer of the bottom electrode and the ferroelectric layer 89. Herein, the second layer of the bottom electrode includes the platinum layer 88 and the iridium oxide layer 87.

A third inter-layer insulation layer 90 is then deposited on an entire surface of the above resulting structure. The third inter-layer insulation layer 90 is planarized until a surface of the ferroelectric layer 89 is exposed. From the planarization process, the third inter-layer insulation layer 90 remains such that it encompasses the second layer of the bottom electrode and the ferroelectric layer 89.

Herein, a CMP process or an etch-back process can be used for the above planarization process. Also, the planarization takes place in two steps by performing initially the CMP process and subsequently performing the etch-back process. For instance, in case of the two step planarization, the CMP process proceeds until the third inter-layer insulation layer 90 remains on the ferroelectric layer 89 with a predetermined thickness. Then, the etch-back process is performed until the surface of the ferroelectric layer 89 is exposed. This two step planarization protects the ferroelectric layer 89 against damages such as scratch shown when only the CMP process is employed.

Herein, the third inter-layer insulation layer 90 is made of one of HDP oxide, BPSG, PSG, MTO, HTO and TEOS oxide and is deposited to a thickness ranging from about 3000 Å to about 30000 Å by using one of a PVD technique, a CVD technique, an ALD technique and a spin-on technique.

Also, the third inter-layer insulation layer 90 can be formed in double layers to reinforce thermal stability and the function as the oxygen barrier layer. An oxygen barrier layer made of a material having a good oxygen barrier property such as $Al_2O_3$, $Si_3N_4$ and SiON is first deposited. Then, a layer made of a material such as HDP oxide, BPSG, PSG, MTO, HTO and TEOS oxide is deposited thereon. Herein, the oxygen barrier layer remains such that it encompasses the bottom electrode to thereby prevent oxygen from being diffused into the bottom electrode during a subsequent thermal process as simultaneously as to prevent oxygen from being diffused into regions below the bottom electrode.

It is possible to perform a thermal process to additionally planarize and densify the third inter-layer insulation layer 90 and to remove moisture. At this time, the thermal process proceeds at a temperature ranging from about 400° C. to about 800° C. in an atmosphere of $N_2$, $O_2$, He, Kr and $O_3$ for about 1 second to about 2 hours.

Figure 7H:
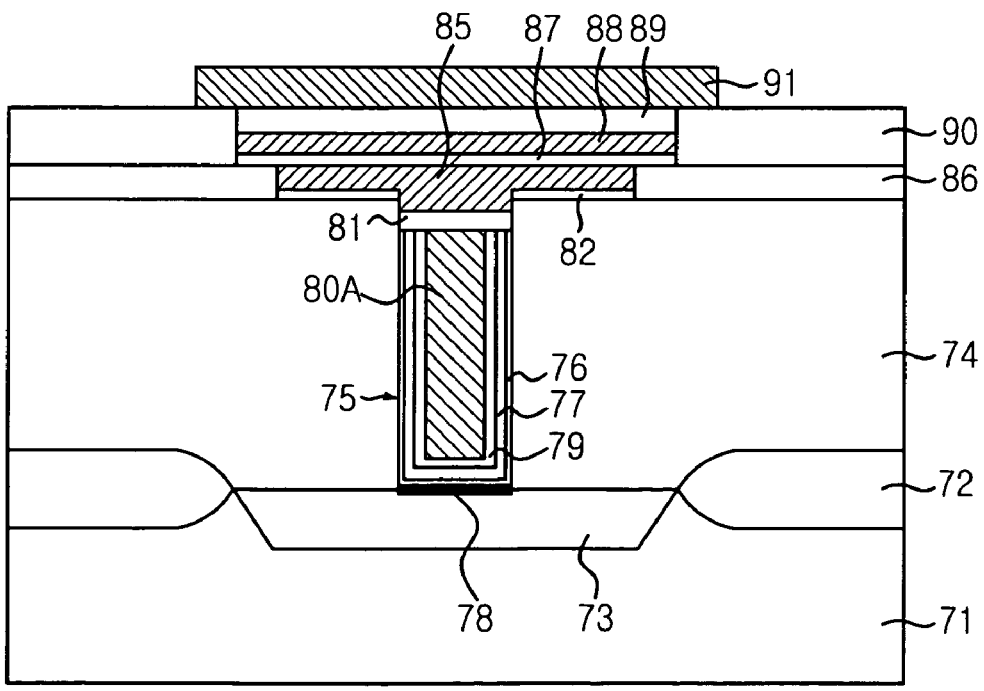

Referring to FIG. 7H, an upper electrode 91 is formed on the exposed ferroelectric layer 89 and the third inter-layer insulation layer 90. At this time, the upper electrode 91 can be formed in a single layer made of a material such as Pt, Ir, Ru, $IrO_2$ and $RuO_2$ or in stacked layers such as $Pt/IrO_2$, $Pt/IrO_2/Ir$, $IrO_2/Ir$, $RuO_2/Ru$, $Pt/RuO_2/Ru$ and $Pt/RuO_2$. Afterwards, the upper electrode 91 is etched in line type.

Meanwhile, a subsequent thermal process with respect to the ferroelectric layer 89 can be performed before depositing the upper electrode 91 or after depositing the upper electrode 91. Even if the thermal process is carried out, the ferroelectric characteristics of the ferroelectric layer 89 can be consistently secured since only the platinum layer 88 remains beneath the ferroelectric layer 89.

Based on the second preferred embodiment of the present invention, the predetermined portion 83 of the adhesion layer 82 disposed above the upper part of the tungsten plug 80A is removed without performing the additional masking and etching process for opening the predetermined portion 83 of the adhesion layer 82. Hence, it is possible to secure a sufficient margin, and thereby increasing an adhesion area between the bottom electrode and the adhesion layer 82. As a result of the increased adhesion area, the oxygen diffusion can be minimized during the thermal process. Accordingly, it is possible to prevent the oxidation of the third titanium nitride layer 81 caused by the diffused oxygen.

Also, the thermal process for crystallizing the ferroelectric layer 89 and removing the impurities proceeds under a state that only the platinum layer 88 remains beneath the ferroelectric layer 89, and thus, it is possible to secure uniformly the ferroelectric characteristics of the ferroelectric layer 89.

In addition, as like the first preferred embodiment, the contact resistance obtained by following the second preferred embodiment is low as well.

FIGS. 8A to 8F are cross-sectional views illustrating a method for fabricating a FeRAM device in accordance with a third preferred embodiment of the present invention.

Figure 8A:
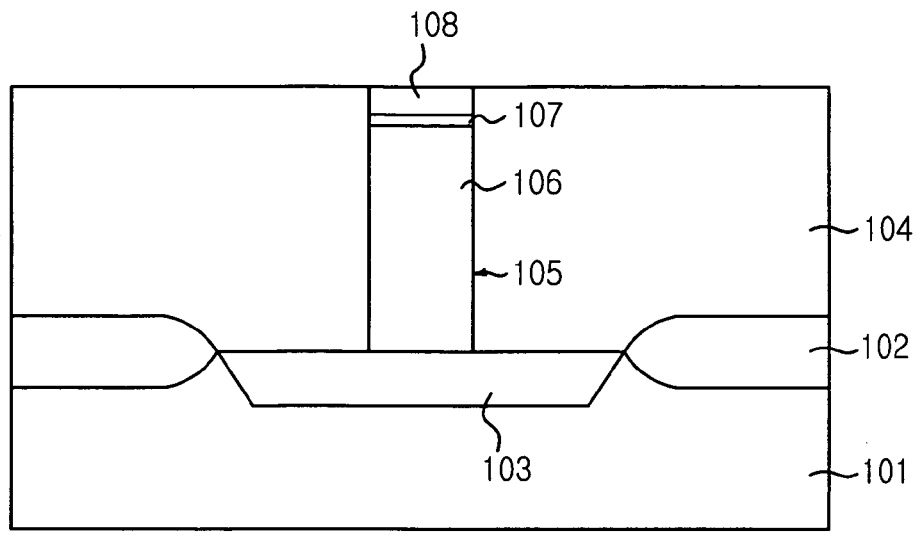
FIGS. 8A to 8F are cross-sectional views illustrating a method for fabricating a FeRAM device in accordance with a third preferred embodiment of the present invention.

Referring to FIG. 8A, field oxide layers 102 are formed in a substrate 101, and an impurity junction region 103 such as a source/drain region of a transistor is formed in the substrate 101. Then, a first inter-layer insulation layer 104 is formed on the substrate 101. At this time, the first inter-layer insulation layer 104 has a multi-layer structure to insulate a word line, a landing plug and a bit line before forming a storage node contact. Preferably, the first inter-layer insulation layer 104 is made of a material selected from a silicon oxide group consisting of HDP oxide, BPSG, PSG, MTO, HTO and TEOS oxide. After the deposition of the first inter-layer insulation layer 104, a chemical mechanical polishing (CMP) process for the purpose of planarization or a thermal process for the purpose of planarization and densification can be performed. At this time, the thermal process proceeds at a temperature ranging from about 400° C. to about 800° C. in an atmosphere of $N_2$, $O_2$, Ar, He, Ne, Kr or $O_3$ for about 1 second to about 2 hours.

Next, the first inter-layer insulation layer 104 is etched to form a storage node contact hole 105 exposing a partial portion of the impurity junction region 103. A polysilicon layer is deposited on an entire surface of a structure including the first inter-layer insulation layer 104 and the storage node contact hole 105. The polysilicon layer is subjected to a recess etch-back process to form a polysilicon plug 106 partially filled into the storage node contact hole 105. At this time, the recess depth of the polysilicon layer preferably ranges from about 500 Å to about 3000 Å.

Although not illustrated, a titanium layer is deposited on the first inter-layer insulation layer 104 and the polysilicon plug 106 with a thickness ranging from about 10 Å to about 500 Å. At this time, the titanium layer is deposited by employing one of a PVD technique, a CVD technique and an ALD technique.

Subsequently, a RTA process is performed to form a titanium silicide layer 107 for an ohmic contact on the polysilicon plug 106. At this time, the RTA process proceeds at a temperature ranging from about 600° C. to about 1000° C. in an atmosphere of $N_2$, $NH_3$, Ar, He, Ne and K for about 1 second to about 10 minutes. The titanium silicide layer 107 can be formed by employing another annealing process performed for about 10 minutes to about 60 minutes with use of a diffusion furnace.

Afterwards, the non-reacted and remaining titanium layer is removed by a wet etching process, and a titanium nitride layer 108 is deposited on the titanium silicide layer 107 and the first inter-layer insulation layer 104 until the titanium nitride layer 108 is completely filled into the storage node contact hole 105. At this time, the thickness of the titanium nitride layer 108 is dependent on the recess depth of the polysilicon layer. If the recess depth is about 1000 Å, the titanium nitride layer 108 is deposited with a thickness greater than about 1500 Å under consideration of process margins.

Then, a buried type titanium nitride structure is formed. For instance, the titanium nitride layer 108 is subjected to a CMP process for planarizing the titanium nitride layer 108 until a surface of the first inter-layer insulation layer 104 is exposed. After the CMP process, the titanium nitride layer 108 remains only on the polysilicon plug 106 within the storage node contact hole 105. In other words, the titanium nitride layer 108 has the buried structure. Eventually, a storage node contact has a stack structure including the polysilicon plug 106, the titanium silicide layer 107 and the titanium nitride layer 108.

In addition to the titanium nitride layer 108 used as a barrier metal layer, such materials as TiN/Ti, TaN, TiAlN, TiSiN, TaSiN, TaSiN, RuTiN, TaAlN, RuTaN, CrTiN and CrTaN can be also used. Also, tantalum (Ta) can be used to form a silicide layer for forming an ohmic contact like the titanium silicide layer 107. Therefore, it is possible to form one of stack structures including TaN/Ta, TiAlN/Ti, TaSiN/Ta, TiSiN/Ti, TaAlN/Ta, RuTiN/Ti and RuTaN/Ta.

Figure 8B:
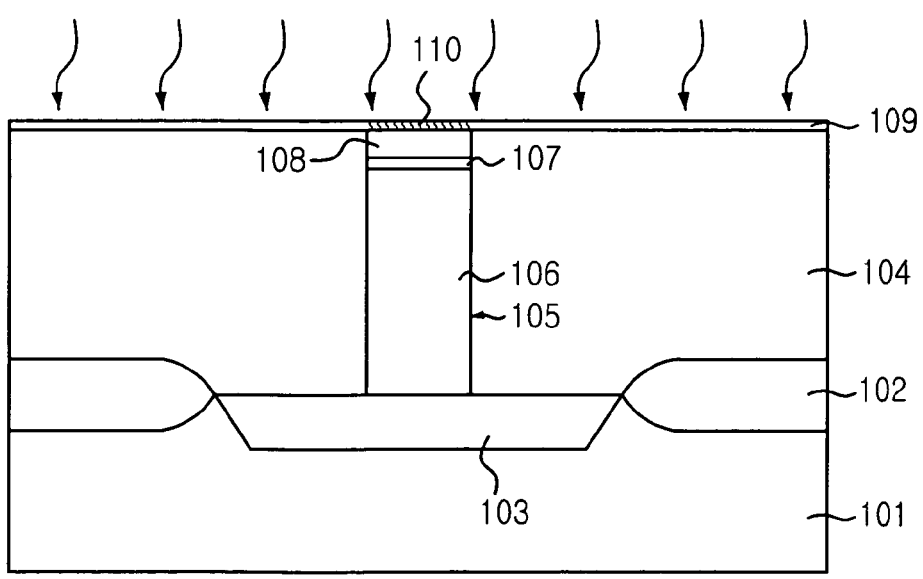

Referring to FIG. 8B, an adhesion layer 109 is formed on the resulting planarized structure including the first inter-layer insulation layer 104 and the titanium nitride layer 108 by employing one of a PVD technique, a CVD technique and an ALD technique. At this time, the adhesion layer 109 is made of $Al_2O_3$ and has a thin thickness ranging from about 10 Å to about 500 Å. The reason for forming the adhesion layer 109 with the thin thickness is to remove the adhesion layer 109 through a thermal process without performing an etching process. That is, this mentioned thickness is a thickness sufficient for providing an adhesion property. Also, the adhesion layer 109 can be made of a material such as $TiO$ and $TaO_2$.

Next, a RTA process is performed to make a predetermined portion 110 of the adhesion layer 109 disposed above the polysilicon plug 106 be cracked. At this time, the RTA process proceeds at a temperature ranging from about 400° C. to about 1000° C. in an atmosphere of $N_2$ and Ar gas. This process conditions prevents oxidation of the polysilicon plug 106.

The predetermined cracked portion 110 is introduced only at a predetermined region, i.e., a region above an upper part of the polysilicon plug 106 and the titanium nitride layer 108 since the thermal expansion coefficient of polysilicon is about 7 times greater than that of silicon oxide ($SiO_x$) used for the first inter-layer insulation layer 104.

In more detail, the thermal expansion coefficient of polysilicon and that of silicon oxide are about $3.5 \times 10^{-6}$ $k^{-1}$ and about $0.5 \times 10^{-6}$ $k^{-1}$. Thus, during the RTA process, the polysilicon plug 106 is expanded and exerts stress to the titanium nitride layer 108 and the adhesion layer 109. As a result of this stress, the crack is introduced only at the predetermined portion 110 of the adhesion layer 109 disposed above the upper part of the polysilicon plug 106. Concurrently, the first inter-layer insulation layer 104 can be expanded during the RTA process. However, since the thermal coefficient of the first inter-layer insulation layer 104 is significantly smaller than that of the polysilicon plug 106, the crack is not introduced at other portions of the adhesion layer 109 disposed over the first inter-layer insulation layer 104. As a reference, thermal expansion coefficient of the alumina used for the adhesion layer 109 is about $6.5 \times 10^{-6}$ $k^{-1}$ and that of the titanium nitride layer 108 is about $9.3 \times 10^{-6} k^{-1}$.

Figure 8C:
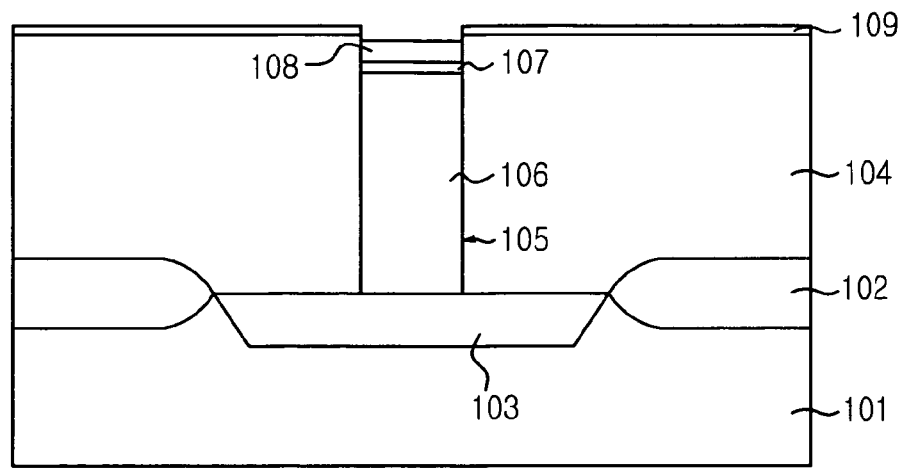

Referring to FIG. 8C, a cleaning process is performed for about 1 minute to about 60 minutes by employing a chemical solution SC-1 obtained by mixing $NH_4OH$, $H_2O_2$ and water $H_2O$ in a ratio of about 1 to about 4 to about 20. In addition to the use of the chemical solution SC-1, it is still possible to use a SPM solution. At this time, for the cleaning process using the SC-1 solution, etch rates of the titanium nitride layer 108, the adhesion layer 109 and first inter-layer insulation layer 104 are about 20 Å per minute, about 5 Å per minute and about 5 Å per minute, respectively. Particularly, the etch rate of the cracked predetermined portion 110 is higher than that of the uncracked portions of the adhesion layer 109.

Therefore, since the chemical solution SC-1 is not capable of etching the first inter-layer insulation layer 104 but capable of etching the titanium nitride layer 108, it is possible to selectively remove the predetermined cracked portion 110 and the titanium nitride layer 108.

After the cleaning process, a junction region between a subsequent bottom electrode and the polysilicon plug 106, e.g., a surface of the titanium nitride layer 108 is opened. At this time, the opened portion is partially etched by the chemical solution SC-1, thereby being depressed downwards. That is, the chemical solution SC-1 penetrates into the cracked predetermined portion 110 to thereby partially etch the titanium nitride layer 108.

Figure 8D:
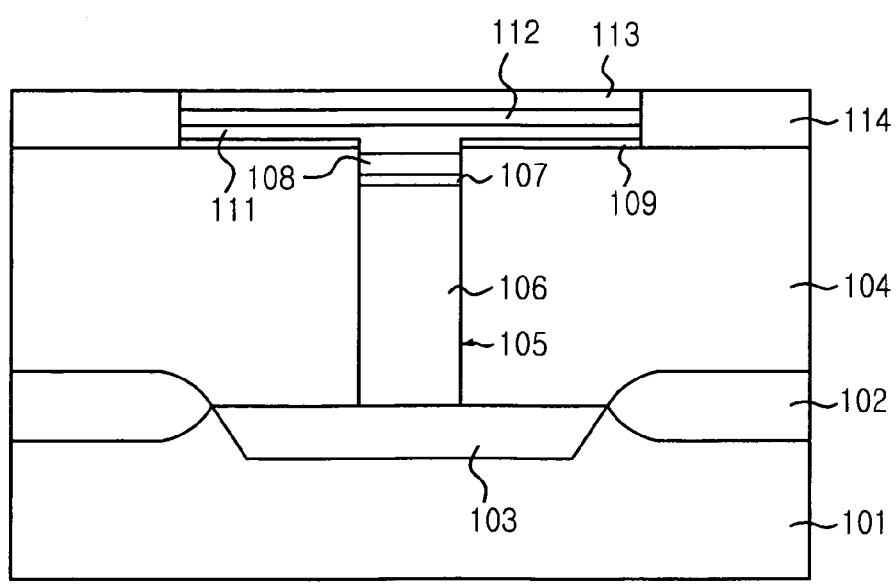

Referring to FIG. 8D, an iridium layer 111, an iridium oxide layer 112 and a platinum layer 113 are sequentially deposited on the adhesion layer 109 and the opened upper part of the polysilicon plug 106 by employing one of a PVD technique, a CVD technique and an ALD technique. At this time, the iridium layer 111 has a thickness ranging from about 100 Å to about 2000 Å. The iridium oxide layer 112 is deposited to a thickness ranging from about 10 Å to about 500 Å. The platinum layer 113 has a thickness ranging from about 100 Å to about 2000 Å. Particularly, the iridium layer 111 serves a function to prevent oxygen from being diffused in a vertical direction. In addition to the use of iridium for such function, it is still possible to use RuTiN, CrTiN, CrTaN and RuTaN.

Next, the platinum layer 113, the iridium oxide layer 112, the iridium layer 111 and the adhesion layer 109 are sequentially etched to form a bottom electrode. Eventually, the bottom electrode having a stack structure including the platinum layer 113, the iridium oxide layer 112 and the iridium layer 111 is formed on the opened upper part of the polysilicon plug 106. The adhesion layer 109 remains on between the iridium layer 111 of the bottom electrode and the first inter-layer insulation layer 104. At this time, the iridium oxide layer 112 and the iridium layer 111 serves as an oxidation barrier layer for preventing the polysilicon plug 106 from being oxidated. Such materials as RuTiN, CrTiN, RuTaN and CrTaN can be also used as the oxidation barrier layer.

After the formation of the bottom electrode, the remaining adhesion layer 109 has a wide contact area with the bottom electrode. Also, since the remaining adhesion layer 109 completely fills any space between the bottom electrode and the first inter-layer insulation layer 104, the bottom electrode is suppressed from being contacted to the first inter-layer insulation layer 104.

Subsequent to the formation of the bottom electrode, a second inter-layer insulation layer 114 is deposited on an entire surface of the resulting structure including the bottom electrode. The second inter-layer insulation layer 114 is then planarized until a surface of the platinum layer 113 is exposed, so that the second inter-layer insulation layer 114 encompasses the bottom electrode. For the above planarization process, a CMP process or an etch-back process can be used. Also, the planarization takes place in two steps by performing initially the CMP process and subsequently performing the etch-back process. For instance, in case of the two step planarization, the CMP process proceeds until the second inter-layer insulation layer 114 remains on the platinum layer 113 with a predetermined thickness. Then, the etch-back process is performed until the surface of the platinum layer 113 is exposed. This two step planarization protects the platinum layer 113 against damages such as scratch shown when only the CMP process is employed.

The second inter-layer insulation layer 114 is made of one of HDP oxide, BPSG, PSG, MTO, HTO and TEOS oxide and is deposited to a thickness ranging from about 3000 Å to about 30000 Å by using one of a PVD technique, a CVD technique, an ALD technique and a spin-on technique.

Also, the second inter-layer insulation layer 114 can be formed in double layers to reinforce thermal stability and the function as the oxygen barrier layer. An oxygen barrier layer made of a material having a good oxygen barrier property such as $Al_2O_3$, $Si_3N_4$ and SiON is first deposited. Then, a layer made of a material such as HDP oxide, BPSG, PSG, MTO, HTO and TEOS oxide is deposited thereon. Herein, the oxygen barrier layer remains such that it encompasses the bottom electrode to thereby prevent oxygen from being diffused into the bottom electrode during a subsequent thermal process as simultaneously as to prevent oxygen from being diffused into regions below the bottom electrode.

It is possible to perform a thermal process to additionally planarize and densify the second inter-layer insulation layer 114 and to remove moisture. At this time, the thermal process proceeds at a temperature ranging from about 400° C. to about 800° C. in an atmosphere of $N_2$, $O_2$, He, Kr and $O_3$ for about 1 second to about 2 hours.

Figure 8E:
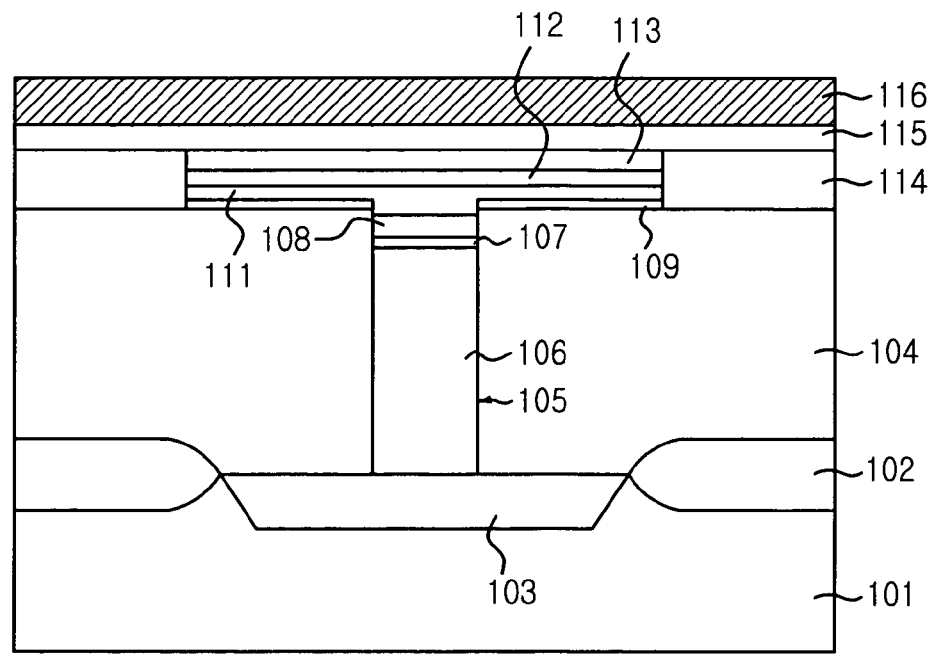

Referring to FIG. 8E, a ferroelectric layer 115 is deposited on the second inter-layer insulation layer 114 and the exposed platinum layer 113. At this time, the ferroelectric layer 115 is deposited to a thickness ranging from about 50 Å to about 2000 Å by employing one of a CVD technique, an ALD technique, metal organic deposition (MOD) technique and a spin coating technique. The ferroelectric layer 115 is made of one of a material selected from a group consisting of SBT, PZT and BLT and a material selected from a group consisting of impurity added or composition ratio changed SBT, PZT, BLT and SBTN.

An upper electrode 116 is formed on the ferroelectric layer 115. At this time, the upper electrode 116 can be formed in a single layer made of a material such as Pt, Ir, Ru, $IrO_2$ and $RuO_2$ or in stacked layers such as $Pt/IrO_2$, $Pt/IrO_2/Ir$, $IrO_2/Ir$, $RuO_2/Ru$, $Pt/RuO_2/Ru$ and $Pt/RuO_2$.

After the formation of the upper electrode 116, a high thermal process is performed to crystallize the ferroelectric layer 115.

Figure 8F:
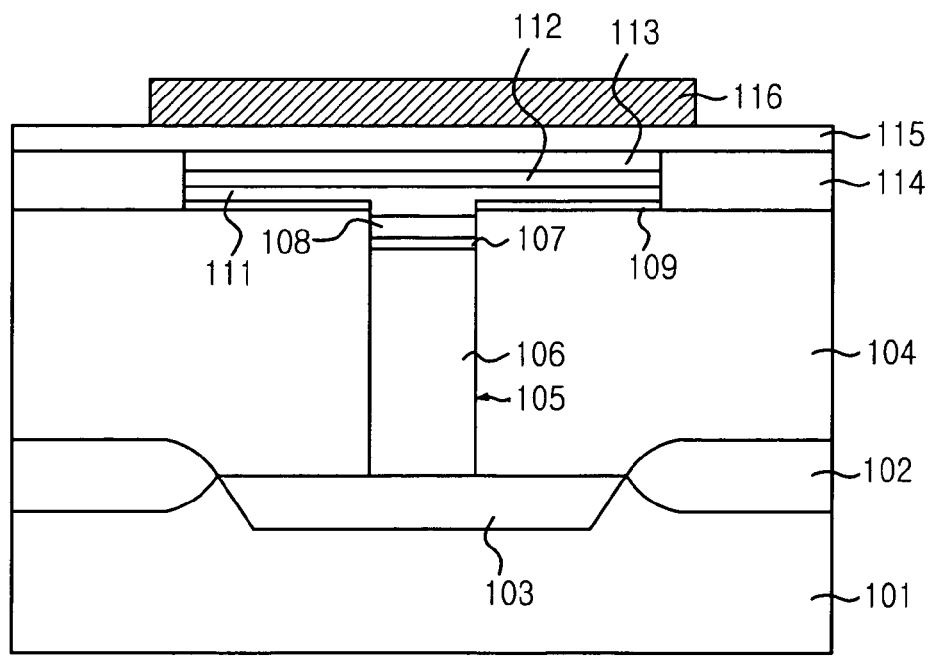

Referring to FIG. 8F, the upper electrode 116 and the ferroelectric layer 115 are simultaneously etched, or the upper electrode 116 is first etched and predetermined portions of the ferroelectric layer 115 are selectively etched. After the etching process, a recovery thermal process proceeds to recover the ferroelectric layer 115 damaged during the above etching process.

On the basis of the third preferred embodiment of the present invention, the adhesion layer 109 disposed on the upper part of the polysilicon plug 106 can be removed without performing an additional masking and etching process for opening the predetermined portion 110 of the adhesion layer 109 to thereby secure a sufficient process margin. As a result, an adhesion area between the bottom electrode and the adhesion layer 109 is increased, and thereby minimizing the oxygen diffusion during the thermal process. Accordingly, it is possible to prevent the oxidation of the titanium nitride layer 108 caused by the diffused oxygen.

In addition, as like the first preferred embodiment, the contact resistance obtained by following the third preferred embodiment is low as well.

Figure 9:
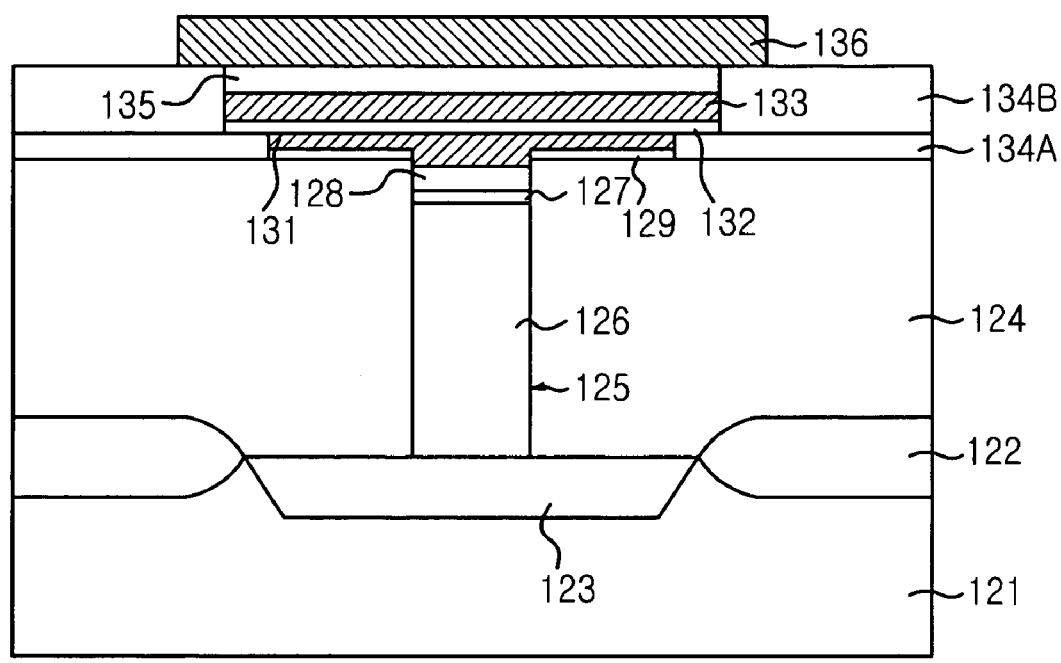
FIG. 9 is a cross-sectional view of a FeRAM device fabricated in accordance with a fourth preferred embodiment of the present invention.

FIG. 9 is a cross-sectional view of a FeRAM device fabricated in accordance with a fourth preferred embodiment of the present invention. It is noted that the FeRAM device is formed by combining processes described in the above preferred embodiments. Prior to forming the bottom electrode, the same processes described in the third preferred embodiment are employed. For the formation of the ferroelectric capacitor, the same processes for forming the bottom electrode, the ferroelectric layer and the upper electrode described in the second preferred embodiment are employed.

In more detail, field oxide layers 122 are formed in a substrate 121, and an impurity junction region 123 such as a source/drain region of a transistor is formed in the substrate 121. A first inter-layer insulation layer 124 with a multi-layer structure is formed on the substrate 121. Then, the first inter-layer insulation layer 124 is etched to form a storage node contact hole 125, and a storage node contact including a polysilicon plug 126, a titanium silicide layer 127 and a titanium nitride layer 128 is filled into the storage node contact hole 125. Next, an adhesion layer 129 is formed on the resulting structure and is subjected to a RTA process to induce a predetermined portion of the adhesion layer 129 disposed above an upper part of the polysilicon plug 126 to be cracked. Thereafter, a cleaning process using one of a SC-1 solution and a SPM solution is performed to etch the cracked predetermined portion of the adhesion layer 129.

An iridium layer 131 is formed on the above opened adhesion layer 129, and the iridium layer 131 and the adhesion layer 129 are etched thereafter. A second inter-layer insulation layer 134A is deposited and planarized thereafter.

An iridium oxide layer 132, the platinum layer 133 and a ferroelectric layer 135 are sequentially deposited on the planarized second inter-layer insulation layer 134A and the iridium layer 131. Then, a thermal process is performed to crystallize the ferroelectric layer 135 and remove impurities.

Subsequently, the ferroelectric layer 135, the platinum layer 133 and the iridium oxide layer 132 are sequentially etched, and a third inter-layer insulation layer 134B is deposited and planarized thereafter. After the planarization of the third inter-layer insulation layer 134B, an upper electrode 136 is deposited on the ferroelectric layer 135 and the third inter-layer insulation layer 134B and is then patterned.

Based on the forth preferred embodiment of the present invention, the predetermined portion of the adhesion layer 129 disposed above the upper part of the polysilicon plug 126 is removed without performing the additional masking and etching process for opening the predetermined portion of the adhesion layer 129. Hence, it is possible to secure a sufficient margin, and thereby increasing an adhesion area between the bottom electrode and the adhesion layer 129. As a result of the increased adhesion area, the oxygen diffusion can be minimized during the thermal process. Accordingly, it is possible to prevent the oxidation of the titanium nitride layer 128 caused by the diffused oxygen.

Also, the thermal process for crystallizing the ferroelectric layer 135 and removing the impurities proceeds under a state that only the platinum layer 133 remain beneath the ferroelectric layer 135, and thus, it is possible to secure uniformly the ferroelectric characteristics of the ferroelectric layer 135.

In addition, as like the first preferred embodiment, the contact resistance obtained by following the forth preferred embodiment is low as well.

In accordance with the first to the fourth preferred embodiments of the present invention, it is possible to fabricate a FeRAM with excellent thermal stability, well-maintained electric properties and high density. As a result of this effect, the fabrication processes can be performed more simply and easily to thereby contribute to improved quality, cost-effective fabrication and increased yields of the semiconductor devices.

While the present invention has been described with respect to certain preferred embodiments, it will be apparent to those skilled in the art that various changes and modifications may be made without departing from the scope of the invention as defined in the following claims.

What is claimed is:

1. A method for fabricating a ferroelectric random access memory device, comprising the steps of:
    (a) forming a first inter-layer insulation layer on a substrate providing a transistor;
    (b) etching the first inter-layer insulation layer to form a storage node contact hole exposing a partial portion of the substrate;
    (c) burying a storage node contact including a plug and a barrier metal layer into the storage node contact hole;
    (d) forming an adhesion layer on the storage node contact and the first inter-layer insulation layer;
    (e) inducing a predetermined portion of the adhesion layer to be cracked by performing a rapid thermal annealing process, the predetermined portion disposed above an upper part of the plug;
    (f) selectively removing the cracked predetermined portion to expose a surface of the barrier metal layer formed on the plug; and
    (g) forming a ferroelectric capacitor connected to the plug through the exposed surface of the barrier metal layer.

2. The method as recited in claim 1, wherein the plug is made of a conductive material having a thermal expansion coefficient greater than that of the first inter-layer insulation layer.

3. The method as recited in claim 2, wherein the first inter-layer insulation layer is made of a silicon oxide-based material and the plug is formed with one of polysilicon or tungsten.

4. The method as recited in claim 1, wherein the rapid thermal annealing process proceeds at a temperature ranging from about 400° C. to about 1000 °C. in an atmosphere of nitrogen ($N_2$) or argon (Ar) gas.

5. The method as recited in claim 1, wherein the step (f) includes a cleaning process carried out for about 1 minute to about 60 minutes with use of one of a chemical solution SC-1 obtained by mixing ammonium hydroxide ($NH_4OH$), hydrogen peroxide ($H_2O_2$) and water ($H_2O$) in a ratio of about 1 to about 4 to about 20 and a sulfuric acid-peroxide mixture (SPM) solution which is a mixture of $H_2SO_4$ and $H_2O_2$.

6. The method as recited in claim 1, wherein the adhesion layer is made of alumina ($Al_2O_3$), titanium oxide ($TiO_2$) and tantalum oxide ($TaO_2$).

7. The method as recited in claim 1, wherein the adhesion layer has a thickness ranging from about 10 Å to about 500 Å.

8. The method as recited in claim 1, wherein the step (g) includes the steps of:

forming a conductive layer for use in a bottom electrode on a structure including the exposed barrier metal layer and the adhesion layer;

forming the bottom electrode by etching the conductive layer and the adhesion layer;

forming a second inter-layer insulation layer having a planarized upper surface and encompassing the lower electrode;

forming a ferroelectric layer on the bottom electrode and the second inter-layer insulation layer; and forming an upper electrode on the ferroelectric layer.

9. The method as recited in claim 1, wherein the step (g) includes the steps of:

forming a first layer for use in a bottom electrode on a structure including the exposed barrier metal layer and the adhesion layer;

etching the first layer and the adhesion layer to form a first stack structure;

forming a second inter-layer insulation layer having a planarized upper surface and encompassing the first stack structure;

sequentially forming a second layer for use in the bottom electrode and a ferroelectric layer on the first stack structure and the second inter-layer insulation layer;

etching the ferroelectric layer and the second layer to form a second stack structure;

forming a third inter-layer insulation layer having a planarized upper surface and encompassing the second stack structure; and forming an upper electrode on the ferroelectric layer.

10. The method as recited in claim 9, wherein the step of performing a thermal process for crystallizing the ferroelectric layer and removing impurities proceeds before or after the step of forming the upper electrode.

11. The method as recited in claim 9, wherein the first layer is made of a material selected from a group consisting of iridium (Ir), ruthenium titanium nitride (RuTiN), chromium tantalum nitride (CrTaN), chromium titanium nitride (CrTiN) and ruthenium tantalum nitride (RuTaN) and the second layer is formed by stacking a platinum (Pt) layer and an iridium oxide ($IrO_2$) layer.

12. The method as recited in claim 8, wherein the second inter-layer insulation layer includes double layers having an oxygen barrier layer made of a material selected from a group consisting of alumina ($Al_2O_3$), silicon nitride ($Si_3N_4$) and silicon oxynitride (SiON) and an insulation layer made of a material selected from a group consisting of high density plasma (HDP) oxide, borophosphosilicate glass (BPSG), phosphosilicate glass (PSG), middle temperature oxide (MTO), high temperature oxide (HTO) and tetraethylorthosilicate (TEOS) oxide or in a single layer including the insulation layer.

13. The method as recited in claim 9, wherein the second inter-layer insulation layer includes double layers having an oxygen barrier layer made of a material selected from a group consisting of $Al_2O_3$, $Si_3N_4$ and SiON and an insulation layer made of a material selected from a group consisting of HDP oxide, BPSG, PSG, MTO, HTO and TEOS oxide or in a single layer including the insulation layer.

14. The method as recited in claim 9, wherein the third inter-layer insulation layer includes double layers having an oxygen barrier layer made of a material selected from a group consisting of $Al_2O_3$, $Si_3N_4$ and SiON and an insulation layer made of a material selected from a group consisting of HDP oxide, BPSG, PSG, MTO, HTO and TEOS oxide or in a single layer including the insulation layer.

* * * * *